(12) United States Patent
Dmitriev-Zdorov

(10) Patent No.: US 9,391,794 B2
(45) Date of Patent: Jul. 12, 2016

(54) GENERATING WORST CASE TEST SEQUENCES FOR NON-LINEARLY DRIVEN CHANNELS

(75) Inventor: Vladimir B. Dmitriev-Zdorov, Longmont, CO (US)

(73) Assignee: Mentor Graphics Corporation, Wilsonville, OR (US)

( * ) Notice: Subject to any disclaimer, the term of this patent is extended or adjusted under 35 U.S.C. 154(b) by 705 days.

(21) Appl. No.: 12/363,354

(22) Filed: Jan. 30, 2009

(65) Prior Publication Data

US 2009/0222234 A1 Sep. 3, 2009

Related U.S. Application Data

(63) Continuation-in-part of application No. 12/150,658, filed on Apr. 29, 2008, which is a continuation-in-part of application No. 11/880,354, filed on Jul. 19, 2007.

(60) Provisional application No. 60/933,807, filed on Jun. 8, 2007, provisional application No. 60/927,163, filed on May 1, 2007.

(51) Int. Cl.
| | |
|---|---|
| G06F 19/00 | (2011.01) |
| H04L 12/26 | (2006.01) |
| H04L 1/24 | (2006.01) |
| G01R 31/317 | (2006.01) |
| G01R 31/3183 | (2006.01) |
| G01R 31/28 | (2006.01) |
| G06F 11/263 | (2006.01) |
| G06F 17/50 | (2006.01) |

(52) U.S. Cl.
CPC ............ *H04L 12/2697* (2013.01); *G01R 31/28* (2013.01); *G01R 31/2801* (2013.01); *G01R 31/3171* (2013.01); *G01R 31/3183* (2013.01); *G01R 31/31708* (2013.01); *G01R 31/318371* (2013.01); *G06F 11/263* (2013.01); (Continued)

(58) Field of Classification Search
CPC ............. G06F 17/5022; G06F 11/263; G06F 17/5036; G06F 17/5009; G01R 31/31708; G01R 31/318371; G01R 31/3171; G01R 31/318342; G01R 31/3167; H04L 1/244
USPC .................................. 702/117, 119, 122, 124
See application file for complete search history.

(56) References Cited

U.S. PATENT DOCUMENTS

| | | | |
|---|---|---|---|
| 4,133,978 A * | 1/1979 | Hewlett, Jr. .................... | 370/504 |
| 6,762,614 B2 * | 7/2004 | Rearick et al. ............. | 324/750.3 |

(Continued)

OTHER PUBLICATIONS

Oh, Dan, Multiple Edge Reposes for Fast and Accurate System Simulations, Electrical Performance of Electronic Packaging, 2006 IEEE, pp. 163-166, Oct. 2006.

(Continued)

*Primary Examiner* — Janet Suglo
*Assistant Examiner* — L. Anderson
(74) *Attorney, Agent, or Firm* — Mentor Graphics Corporation

(57) ABSTRACT

Various implementations of the invention provide methods and apparatuses for generating a test sequence for a driver and channel combination, wherein the driver is non-linear. In various implementations of the invention, a test sequence is generated that produces the worst or near worst error rate of the channel. With various implementations of the invention, voltage waves at the driver and impulse response waves of the channel are generated. In various implementations of the invention, the driver voltage waves and impulse response waves are simulated responses of the driver and channel to a digital signal input. With further implementations of the invention, receiver voltage waves are generated by combining the impulse response wave and the driver voltage waves. Subsequently, a test sequence is selected based upon the combined receiver voltage wave.

30 Claims, 13 Drawing Sheets

(52) U.S. Cl.
CPC ............. *H04L 1/244* (2013.01); *H04L 43/50* (2013.01); *G01R 31/318357* (2013.01); *G06F 17/5009* (2013.01)

(56) References Cited

U.S. PATENT DOCUMENTS

| | | | |
|---|---|---|---|
| 7,308,620 B1* | 12/2007 | Talbot | 714/707 |
| 7,370,250 B2* | 5/2008 | Yuan | 714/718 |
| 2003/0158687 A1* | 8/2003 | Nygaard et al. | 702/117 |
| 2009/0285341 A1* | 11/2009 | Pukkila et al. | 375/346 |
| 2010/0179784 A1* | 7/2010 | Crosby et al. | 702/117 |

OTHER PUBLICATIONS

Ren, Jihong, and Oh, Kyung Suk, Multiple Edge Responses for Fast and Accurate System Simulations, IEEE Trans on Advanced Packaging, V.31, No. 4, Nov. 2008.

* cited by examiner

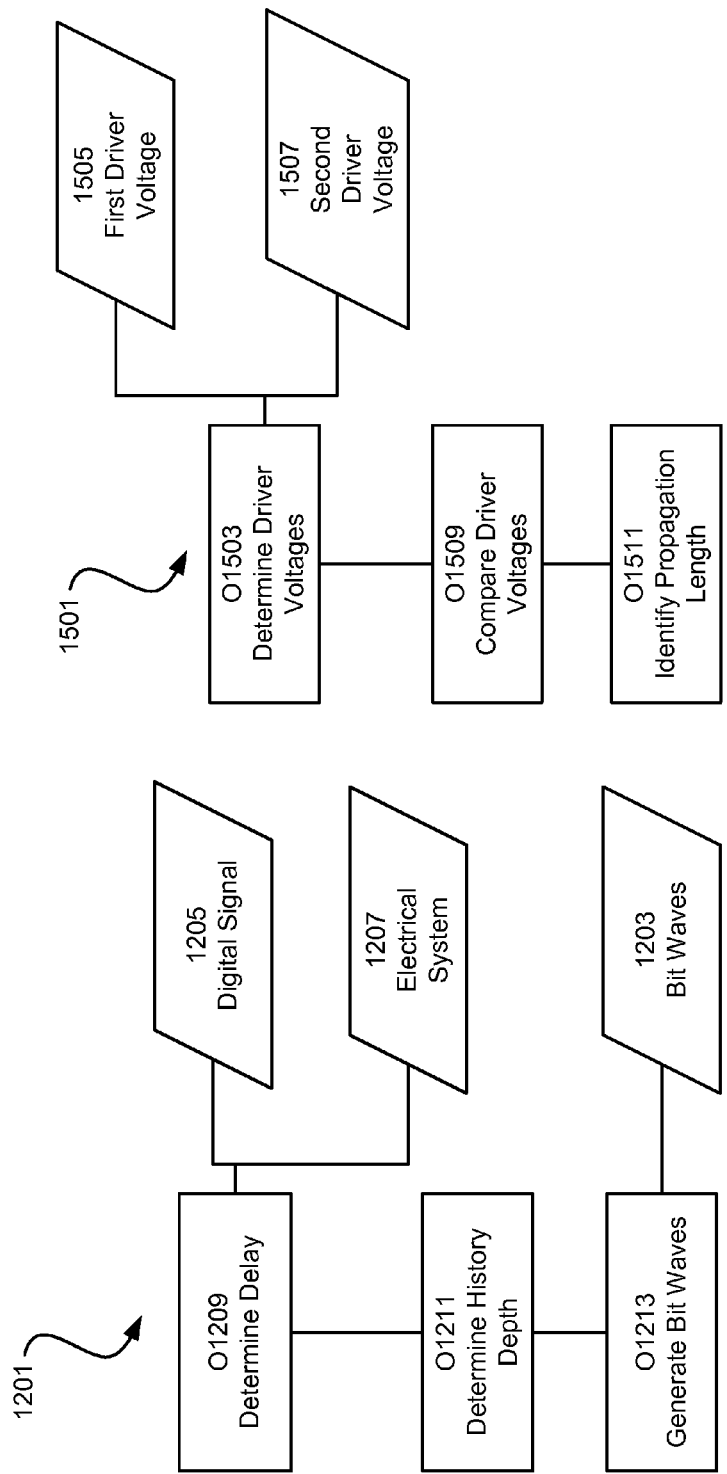

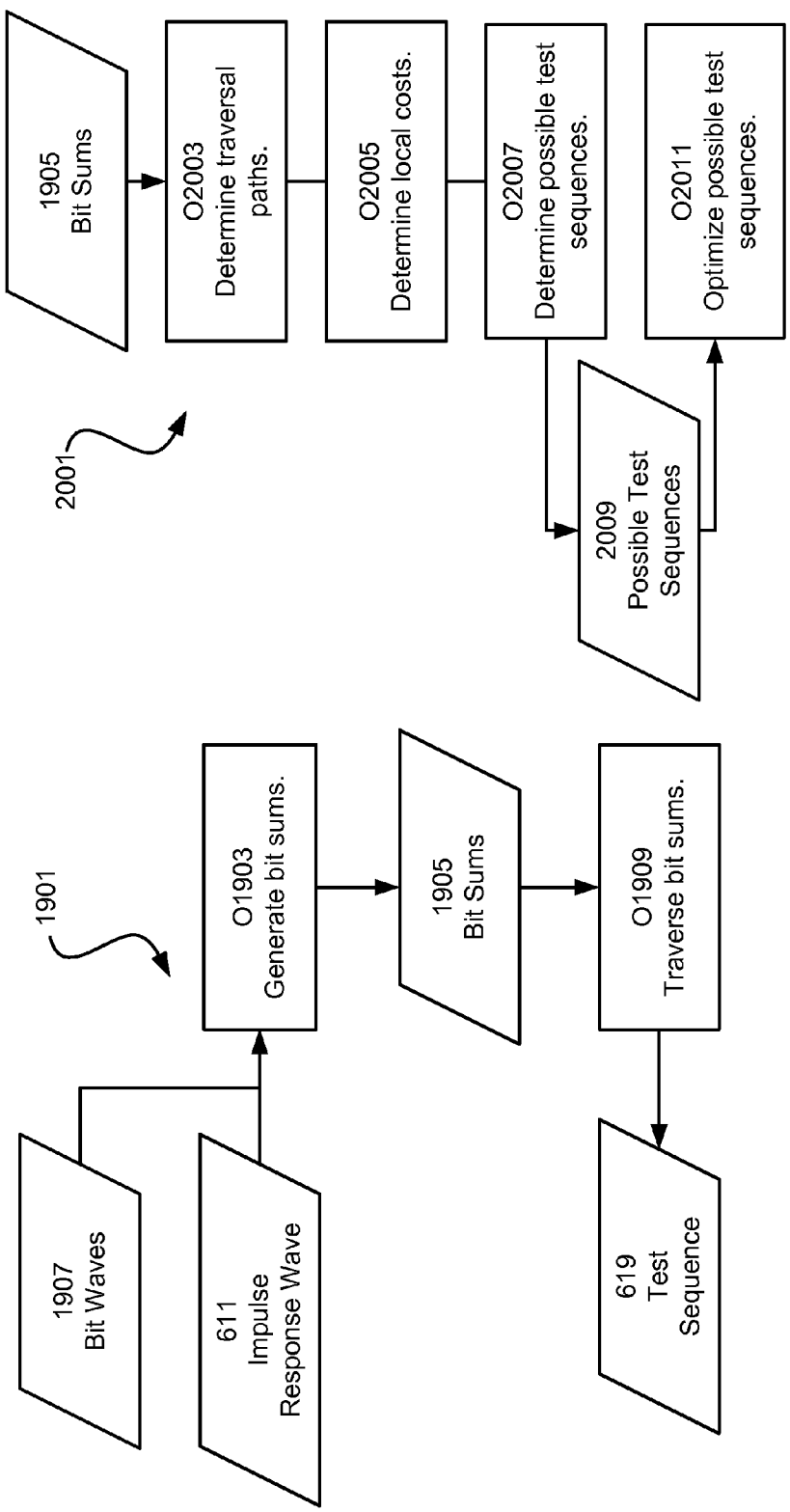

GENERATING WORST CASE TEST SEQUENCES FOR NON-LINEARLY DRIVEN CHANNELS

RELATED APPLICATIONS

This application is a continuation-in-part of, and claims priority under 35 U.S.C. §120 to, U.S. patent application Ser. No. 12/150,658, currently pending, entitled "Generating Test Sequences for Circuit Channels Exhibiting Duty-Cycle Distortion," filed on Apr. 29, 2008, which application is a continuation-in-part of, and claims priority under 35 U.S.C. §120 to, U.S. patent application Ser. No. 11/880,354, currently pending, entitled "Generating Transmission-Code Compliant Test Sequences", filed on Jul. 19, 2007, which application further claims priority under 35 U.S.C. §119(e) to U.S. Provisional Patent Application No. 60/933,807, entitled "Worst-Case pattern Generation for a Linear Channel in Cases of Bit Sequences with Duty-Cycle Distortion", filed on Jun. 8, 2007, and additionally to U.S. Provisional Patent Application No. 60/927,163, entitled "Worst-Case Pattern Generation for Linear Signal Channels," and filed on May 1, 2007. U.S. Provisional Patent Application Nos. 60/933,807 and 60/927, 163 as well as U.S. patent application Ser. Nos. 11/880,354 and 12/150,658 are all incorporated entirely herein by reference.

FIELD OF THE INVENTION

The invention relates to the field of electronic design automation. More specifically, various embodiments of the invention may be employed to generate a sequence of bits useful for analyzing the integrity of signals and devices for transmitting or carrying signals.

BACKGROUND OF THE INVENTION

Modern digital electronic circuits and systems transmit or convey sequences of binary values, commonly referred to as bit sequences or digital signals. These bit sequences are conveyed as voltage waveforms, wherein the voltage amplitude for a given time period or bit, corresponds to a binary logic value at that same time period. Accordingly, a digital signal appears as a voltage waveform in the signal lines and transmission channels of electronic systems. As a digital signal is transmitted through a circuit, various effects may cause the signal to degrade, often to the point that errors occur. Errors within a digital signal may be quantified by a bit error rate. In many instances, the bit error rate of a circuit or signal pathway is defined as the ratio of incorrectly received bits to the total number of bits transmitted. An important consideration in digital electronic design is fidelity, or the quality with which a signal is conveyed. The fidelity of an electronic system is often referred to as signal integrity. As designers have increased the speed of operation and manufacturing has scaled the physical dimensions of today's modern circuits, signal integrity has become increasingly more important. Currently, virtually all electronic circuits are designed with signal integrity in mind.

Digital electronic designers often employ techniques to assist in optimizing the performance and signal integrity of their designs. Various techniques that simulate or predict the signal integrity of pathways used to transmit signals within a circuit are often employed. Typically, these techniques are used prior to the circuit ever being manufactured, by for example simulating the signal integrity. By adding simulation techniques to the design phase of a devices development, signal integrity problems can often be identified before the device is ever manufactured. For example, simulation tools can assist the designer in accounting for issues that commonly cause signal degradation, such as ringing, crosstalk, noise, ground bounce, or intersymbol interference.

Integrated circuit (IC) design and printed circuit board (PCB) design are two areas where electronic design automation tools may be used to analyze, correct, or prevent signal integrity problems. In particular, the pathways that transmit signals between various components on a printed circuit board or within an integrated circuit, often referred to as channels, may be analyzed for signal integrity problems. For example, the signal integrity of a channel between a driver and a buffer of a printed circuit board (PCB) layout may be analyzed. Generally, it is analyzed so that the bit error rate of the channel may be accurately predicted and minimized prior to manufacturing.

As discussed above, a digital signal is comprised of a series or sequence of bits. As further stated above, it is desirable to maximize the integrity with which the channel transmits a digital signal. In order to assist in maximizing the signal integrity of a channel, the channel is often tested under its worst possible operating condition. This may be accomplished by generating a digital signal or bit sequence that produces the worst possible signal integrity values for the channel. More particularly, the bit sequence which experiences the greatest distortion or degradation as it is transmitted through the channel is desired. By testing the channel against the "worst case bit sequence", designers can optimize the channels signal integrity.

Currently, methods, apparatuses, and systems exist for selecting a "worst case bit sequence" for an electronic circuit where the transmitter or driver and the channel are linear and time invariant. The concepts of linearity and time invariance are further discussed in greater detail below. Although a wide variety of electronic devices contain linear and time invariant components, many channels within modern electronic devices are driven or connected to a transmitter that is not linear. As indicated above, the signal integrity of channels within electronic systems are desirably tested. Accordingly, methods, apparatuses, and systems for generating a "worst case bit sequence" for a non-linear transmitter connected to a channel are desired.

SUMMARY OF THE INVENTION

Various implementations of the invention provide methods and apparatuses for generating a test sequence for a driver and channel combination, wherein the driver is non-linear. In various implementations of the invention, a test sequence is generated that produces the worst or near worst error rate of the channel. With various implementations of the invention, voltage waves at the driver and impulse response waves of the channel are generated. In various implementations of the invention, the driver voltage waves and impulse response waves are simulated responses of the driver and channel to a digital signal input. With further implementations of the invention, receiver voltage waves are generated by combining the impulse response wave and the driver voltage waves. Subsequently, a test sequence is selected based upon the combined receiver voltage wave.

These and additional aspects of the invention will be further understood from the following detailed disclosure of illustrative embodiments.

BRIEF DESCRIPTION OF THE DRAWINGS

The present invention will be described by way of illustrative embodiments shown in the accompanying drawings in which like references denote similar elements, and in which:

FIG. 12 illustrates a method for determining a test sequence;

FIG. 15 illustrates a method for determining a history depth associated with an electronic system;

FIG. 19 illustrates a method of generating a worst case test sequence for a channel; and FIG. 20 illustrates a method for traversing bit sums.

DETAILED DESCRIPTION OF ILLUSTRATIVE EMBODIMENTS

Introduction

Detailed herein are methods, apparatuses, and systems for analyzing circuit channels, typically channels designed to carry high-speed signals. The disclosed methods, apparatus, and systems may be used, for example, in a printed circuit board or an integrated circuit design flow to analyze signal integrity. The disclosed methods, apparatus, and systems should not be construed as limiting in any way. Instead, the present disclosure is directed toward all novel and nonobvious features and aspects of the various disclosed methods, apparatus, systems, and equivalents thereof, alone and in various combinations and subcombinations with one another. The present disclosure is not limited to any specific aspect or feature, or combination thereof, nor do the disclosed methods, apparatus, and systems require that any one or more specific advantages be present or problems be solved.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the figures may not show the various ways in which the disclosed methods, apparatus, and systems can be used in conjunction with other methods, apparatus, and systems. Additionally, the description sometimes uses terms like "generate" and "determine" to describe the disclosed methods. These terms are high-level abstractions of the actual operations that are performed. The actual operations that correspond to these terms may vary depending on the particular implementation and are readily discernible by one of ordinary skill in the art.

Various implementations of the invention may be employed to generate bit sequences for analyzing the signal integrity of a channel. For example, traces, vias or other interconnects between a driver and a receiver in a printed circuit board layout may be tested. As introduced above, the signal integrity of a digital circuit may be analyzed by first providing a bit sequence to the digital circuit and second comparing the response of the digital circuit to the bit sequence. Accordingly, the degradation of the bit sequence as a result of its being transmitted through the digital circuit will be apparent. Furthermore, it is often desirable that the bit sequence selected produces the worst or near worst bit error rate or the channel under test. As a result, the digital circuit may be analyzed under it worst or near worst possible operating conditions. Herein, the bit sequence generated is interchangeably referred to as the test sequence.

Figure 1A:
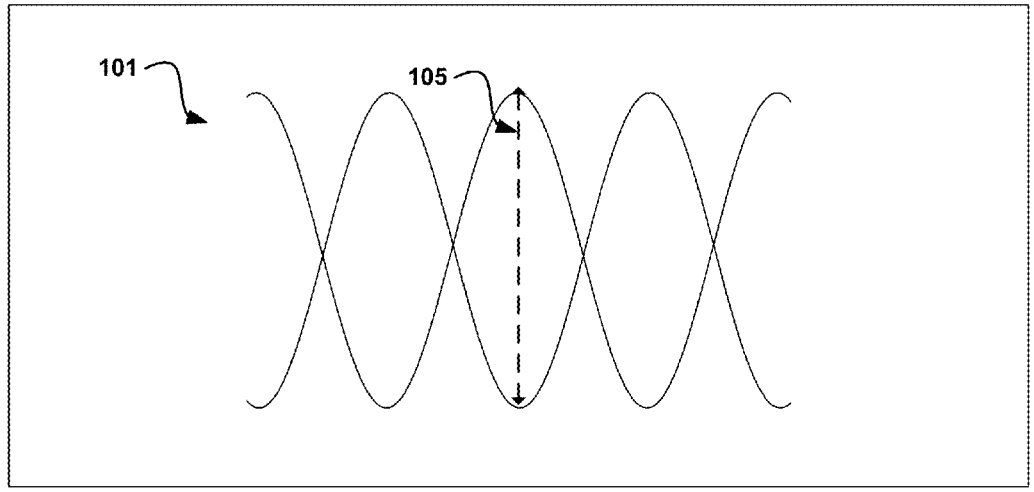
FIG. 1A illustrates an eye diagram, showing the signal integrity of a circuit pathway.
Figure 1B:
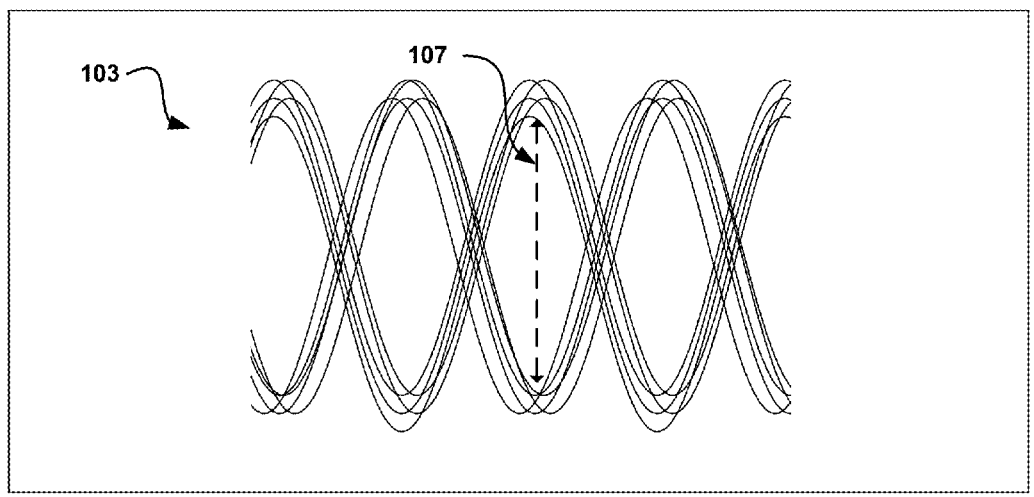
FIG. 1B illustrates an eye diagram, showing the signal integrity of a circuit pathway.

In addition to the bit error rate, the signal integrity of a channel is often analyzed by creating an "eye" diagram. An eye diagram is created by repeatedly sampling a digital signal and overlaying the various samples onto each other. An eye diagram may be created from signal measurement tools, such as an oscilloscope. Alternatively, an eye diagram may be created by overlaying simulated digital signals. FIG. 1A illustrates an eye diagram 101, while FIG. 1B illustrates an eye diagram 103. As can be seen in FIG. 1A and FIG. 1B, the eye diagram 101 is undistorted, while the eye diagram 103 contains distortions. An eye diagram may appear distorted, such as the eye diagram 103, due to various electronic effects. For example, noise, timing issues, overshoot or undershoot will often manifest themselves as amplitude and phase errors within an eye diagram. The amount of distortion is often quantified by an opening in the eye diagram. FIG. 1A illustrates an opening 105 and FIG. 1B illustrates an opening 107. With various implementations of the invention, a bit sequence will be selected to produce to the largest eye opening in an eye diagram. With other implementations of the invention, a bit sequence will be selected to produce the smallest opening in an eye diagram.

Various implementations of the invention apply to generating a bit sequence for analyzing the signal integrity of a channel within an electronic device. For example, a printed circuit board, application-specific integrated circuits (ASICs), including mixed-signal application-specific integrated circuits, systems-on-a-chip (SoCs), programmable logic devices (PLDs), such as field programmable gate arrays (FPGAs), fiber-optic transmission networks, optical channels, such as an optical channel between two components of an integrated circuit. Furthermore, techniques can also be employed to create sequences used to evaluate the integrity of power carrying channels. As stated above, a physical electronic device may be employed in various implementations of the invention. However, with various other implementations of the invention, a simulated instance of the electronic device is employed. Herein, a distinction between employing a physical electronic device or a simulated instance of the electronic device is not always made, as those of skill in the art are capable of practicing the invention based by employing either simulation or physical measurement tools.

Any of the methods or techniques described herein can be performed using software that comprises computer executable instructions for causing a computer to perform the methods or techniques stored on one or more computer readable medium. Such software can comprise, for example, an electronic design automation (EDA) tool, such as a signal integrity tool. The Hyperlynx tool available from Mentor Graphics Corporation of Wilsonville, Oreg. is one example of a suitable software tool. With various implementations of the invention, the software may be executed on a single computer. With other implementations, the software may be executed upon a networked computer system. For example, via the Internet, a wide-area network, a local-area network, a client-server network, or other such network. For clarity, only certain selected aspects of the software based implementations are described. Other details that are well known in the art are omitted. For example, it should be understood that the disclosed technology is not limited to any specific computer language, program, or computer and that the disclosed technology can be implemented using any commercially available computer. An illustrative computing environment is described, but it is to be understood that this environment is not limiting and although all possible computing environments are not described, those of skill in the art are still capable of practicing the invention based upon the following disclosure.

With various implementations, the intermediate results or the final output produced by any of the disclosed methods, apparatus, and systems can be stored on one or more computer readable medium as part of the described methods and techniques. Additionally, a computer readable medium bearing the intermediate results or the final output may be accessed and used by a single computer or a networked computer.

Various implementations of the invention may use circuit design information. For example, printed circuit board layout information, such as a .HYP file, device models such as IBIS models, netlists, GDSII descriptions, or HDL descriptions such as Verilog or VHDL description, or other similar layout or device design description stored on one or more computer readable medium. In certain implementations, the circuits to be simulated are instantiated as SPICE or Eldo models for simulation. For presentation purposes, the present disclosure sometimes refers to circuit components by their physical counterparts, such as drivers, channels, signals, and other such terms. It should be understood, however, that any such reference not only includes the physical components but also representations of such circuit components and signals on the components as may be used in a computer implemented signal integrity analysis environment.

As stated above, the bit sequence or the test sequence generated desirably results in the "worst" signal integrity performance of the channel. It is to be understood that the term "worst" does not necessarily refer to the absolute worst, but encompasses test sequences that cause the output level or voltage level of the channel to be altered from a threshold output level. Additionally, the "worst" test sequence may be defined as the test sequence that produces a bit error rate greater than a specified ratio. Furthermore, the "worst" test sequence may be defined as the test sequence that produces an eye opening in an eye diagram larger or smaller than a predefined percentage.

Exemplary Computing Environment

As stated above, various embodiments of the invention are implemented using computer executable software instructions executed by one or more programmable computing devices. Because these examples of the invention may be implemented using software instructions, the components and operation of a generic programmable computer system on which various embodiments of the invention may be employed is described. Further, because of the complexity of some electronic design automation processes and the large size of many circuit designs, various electronic design automation tools are configured to operate on a computing system capable of simultaneously running multiple processing threads. The components and operation of a computer network 201 having a host or master computer and one or more remote or slave computers therefore will be described with reference to FIG. 2. This operating environment is only one example of a suitable operating environment, however, and is not intended to suggest any limitation as to the scope of use or functionality of the invention.

Figure 2:
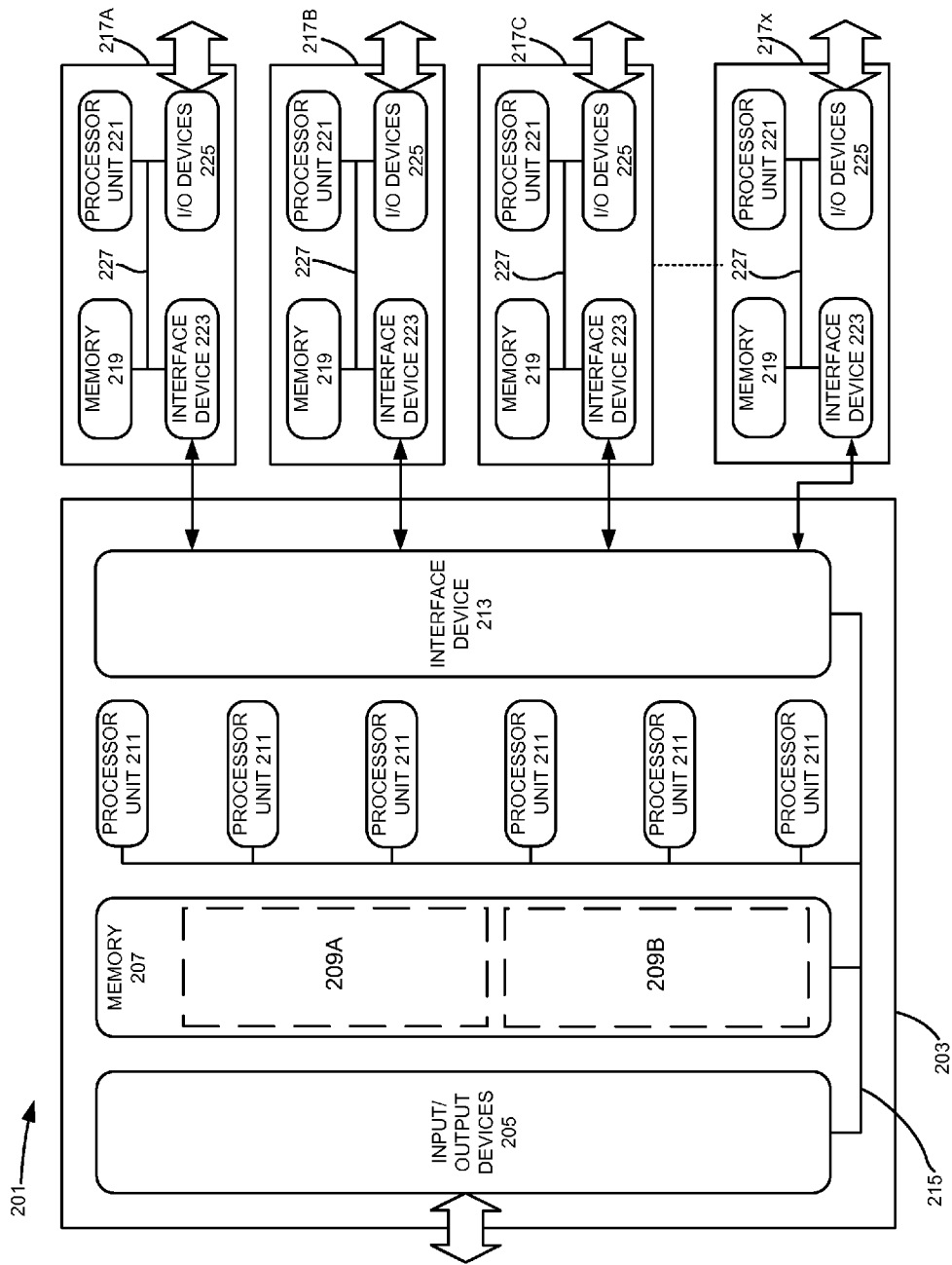
FIG. 2 illustrates a computer system, useable for implementing various embodiments of the present invention.

In FIG. 2, the computer network 201 includes a master computer 203. In the illustrated example, the master computer 203 is a multi-processor computer that includes a plurality of input and output devices 205 and a memory 207. The input and output devices 205 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 207 may similarly be implemented using any combination of computer readable media that can be accessed by the master computer 203. The computer readable media may include, for example, microcircuit memory devices such as random access memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 203 runs a software application for performing one or more operations according to various examples of the invention. Accordingly, the memory 207 stores software instructions 209A that, when executed, will implement a software application for performing one or more operations. The memory 207 also stores data 209B to be used with the software application. In the illustrated embodiment, the data 209B contains process data that the software application uses to perform the operations, at least some of which may be parallel.

The master computer 203 also includes a plurality of processor units 211 and an interface device 213. The processor units 211 may be any type of processor device that can be programmed to execute the software instructions 209A, but will conventionally be a microprocessor device. For example, one or more of the processor units 211 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 211 may be a custom manufactured processor, such as a microprocessor designed to optimally perform specific types of mathematical operations. The interface device 213, the processor units 211, the memory 207 and the input/output devices 205 are connected together by a bus 215.

Figure 3:
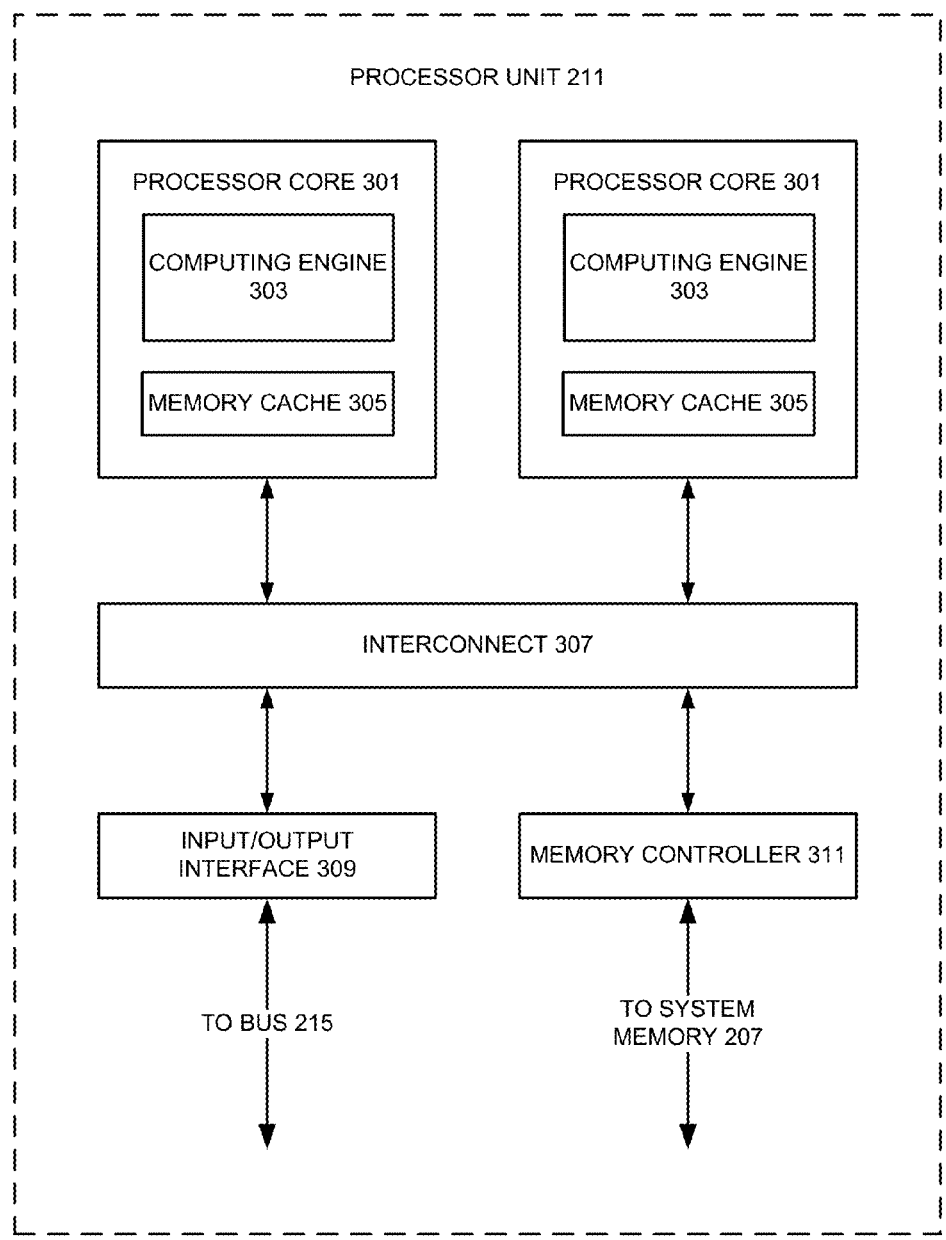
FIG. 3 illustrates a computer processing unit of the computer system illustrated in FIG. 2.

With some implementations of the invention, the master computing device 203 may employ one or more processing units 211 having more than one processor core. Accordingly, FIG. 3 illustrates an example of a multi-core processor unit 211 that may be employed with various embodiments of the invention. As seen in this figure, the processor unit 211 includes a plurality of processor cores 301. Each processor core 301 includes a computing engine 303 and a memory cache 305. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 303 may then use its corresponding memory cache 305 to quickly store and retrieve data and/or instructions for execution.

Each processor core 301 is connected to an interconnect 307. The particular construction of the interconnect 307 may vary depending upon the architecture of the processor unit 301. With some processor cores 301, such as the Cell microprocessor created by Sony Corporation, Toshiba Corporation and IBM Corporation, the interconnect 307 may be implemented as an interconnect bus. With other processor cores 301, however, such as the Opteron™ and Athlon™ dual-core processors available from Advanced Micro Devices of Sunnyvale, Calif., the interconnect 307 may be implemented as a system request interface device. In any case, the processor cores 301 communicate through the interconnect 307 with an input/output interfaces 309 and a memory controller 311. The input/output interface 309 provides a communication interface between the processor unit 211 and the bus 215. Similarly, the memory controller 311 controls the exchange of information between the processor unit 211 and the system memory 207. With some implementations of the invention, the processor units 211 may include additional components, such as a high-level cache memory accessible shared by the processor cores 301.

While FIG. 3 shows one illustration of a processor unit 211 that may be employed by some embodiments of the invention, it should be appreciated that this illustration is representative only, and is not intended to be limiting. For example, some embodiments of the invention may employ a master computer 203 with one or more Cell processors. The Cell processor employs multiple input/output interfaces 309 and multiple memory controllers 311. Also, the Cell processor has nine different processor cores 301 of different types. More particularly, it has six or more synergistic processor elements (SPEs) and a power processor element (PPE). Each synergistic processor element has a vector-type computing engine 203 with 128×128 bit registers, four single-precision floating point computational units, four integer computational units, and a 256 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 211 can be used in lieu of multiple, separate processor units 211. For example, rather than employing six separate processor units 211, an alternate implementation of the invention may employ a single processor unit 211 having six cores, two multi-core processor units 211 each having three cores, a multi-core processor unit 211 with four cores together with two separate single-core processor units 211, or other desired configuration.

Returning now to FIG. 2, the interface device 213 allows the master computer 203 to communicate with the slave computers 217A, 217B, 217C . . . 217x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 213 translates data and control signals from the master computer 203 and each of the slave computers 217 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each slave computer 217 may include a memory 219, a processor unit 221, an interface device 223, and, optionally, one more input/output devices 225 connected together by a system bus 227. As with the master computer 203, the optional input/output devices 225 for the slave computers 217 may include any conventional input or output devices, such as keyboards, pointing devices, microphones, display monitors, speakers, and printers. Similarly, the processor units 221 may be any type of conventional or custom-manufactured programmable processor device. For example, one or more of the processor units 221 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 221 may be custom manufactured processors, such as microprocessors designed to optimally perform specific types of mathematical operations. Still further, one or more of the processor units 221 may have more than one core, as described with reference to FIG. 3 above. For example, with some implementations of the invention, one or more of the processor units 221 may be a Cell processor. The memory 219 then may be implemented using any combination of the computer readable media discussed above. Like the interface device 213, the interface devices 223 allow the slave computers 217 to communicate with the master computer 203 over the communication interface.

In the illustrated example, the master computer 203 is a multi-processor unit computer with multiple processor units 211, while each slave computer 217 has a single processor unit 221. It should be noted, however, that alternate implementations of the invention may employ a master computer having single processor unit 211. Further, one or more of the slave computers 217 may have multiple processor units 221, depending upon their intended use, as previously discussed. Also, while only a single interface device 213 or 223 is illustrated for both the master computer 203 and the slave computers 217, it should be noted that, with alternate embodiments of the invention, either the master computer 203, one or more of the slave computers 217, or some combination of both may use two or more different interface devices 213 or 223 for communicating over multiple communication interfaces.

With various examples of the invention, the master computer 203 may be connected to one or more external data storage devices. These external data storage devices may be implemented using any combination of computer readable media that can be accessed by the master computer 203. The computer readable media may include, for example, microcircuit memory devices such as random access memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the slave computers 217 may alternately or additions be connected to one or more external data storage devices. Typically, these external data storage devices will include data storage devices that also are connected to the master computer 203, but they also may be different from any data storage devices accessible by the master computer 203.

It also should be appreciated that the description of the computer network illustrated in FIG. 2 and FIG. 3 is provided as an example only and is not intended to suggest any limitation as to the scope of use or functionality of alternate embodiments of the invention.

Electrical System Including a Channel

Figure 4:
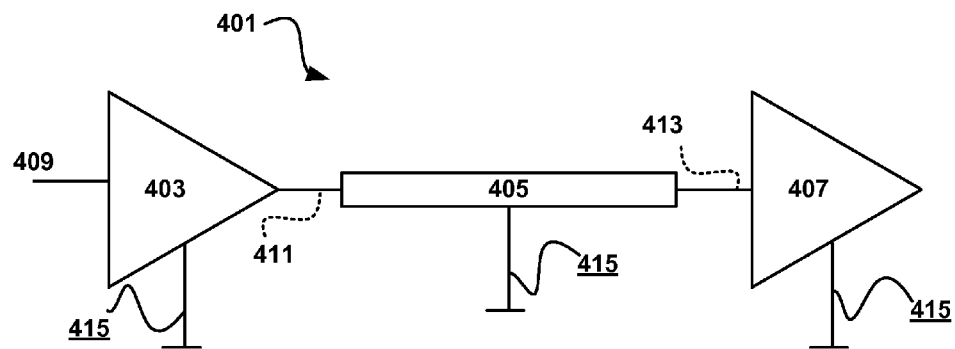
FIG. 4 illustrates an electrical system.

With various implementations of the invention, a test sequence for testing a channel within an electrical system is generated. FIG. 4 illustrates an exemplary electrical system 401, which may have a test sequence generated for it according to various implementations of the present invention. As can be seen in FIG. 4, the electrical system 401 includes a driver 403, a channel 405, and a buffer 407. With various implementations of the invention, the driver 403 is a non-linear driver. In general, an electrical component exhibits non-linear behavior when the sum of its responses does not equal the sum of its inputs. More particularly, in a linear system the response to the bit sequence '010' summed with the response to the bit sequence '001' would equal the response to the bit sequence '011'. The principle of linearity is often explained mathematically as follows. Given a function F wherein $Y_1=F(X_1)$ and $Y_2=F(X_2)$, if $X_s=X_1+X_2$ then $Y_s=F(X_s)=Y_1+Y_2$. In a non-linear system, the response to the bit sequence '011' may not equal the summed responses to the bit sequences '010' and '001'. Employing the same function F, and $Y_1$, $Y_2$, and $X_s$ defined above, in a non-linear system $Y_s=F(X_s) \neq Y_1+Y_2$.

As can be seen in FIG. 4, the driver 403 includes an input 409 for receiving a digital signal, or d(t). Additionally, the driver 403 and the buffer 407 are connected by the channel 405. When a digital signal d(t) is placed on the driver 403 via the input 409, a response or voltage waveform, or V(t) is seen at the channel 405. The voltage waveform V(t) is often referred to as the driver voltage, or the transmitter voltage. The response of the driver 403 is measurable at a point 411 in the electrical system 401. Additionally, the response of the channel, or W(t), often referred to as the waveform at the receiver, or the receiver voltage, and is measurable at a point 413 in the electrical system 401. Furthermore, as can be seen in FIG. 4, the driver 403, the channel 405, and the buffer 407 are typically connected to a plurality of ground terminals 415.

Figure 5A:
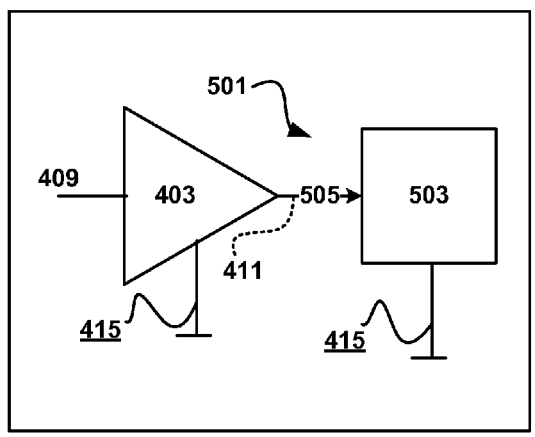
FIG. 5A illustrates a portion of the electrical system of FIG. 4, shown in further detail.
Figure 5B:
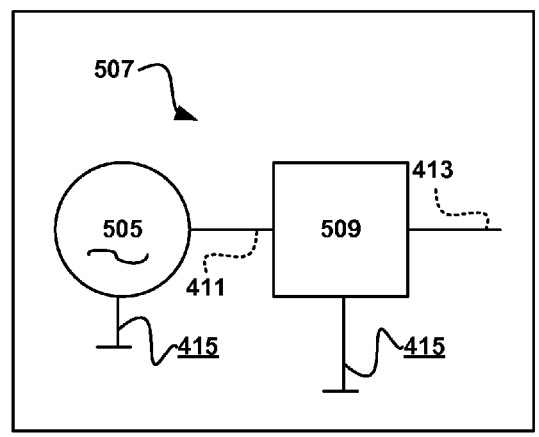
FIG. 5B illustrates a portion of the electrical system of FIG. 4, shown in further detail.

The electrical system 401 may be transformed and represented as two separate electrical systems, as illustrated by FIG. 5A and FIG. 5B. With various implementations of the invention, it is desirable to perform these transformations. FIG. 5A illustrates a model 501 that may be implemented to find the driver voltage V(t). As can be seen in FIG. 5A, the model 501 includes the driver 403, the input 409, and an element 503. The element 503 represents the admittance (Y(s)) of the channel 405, often referred to as the input impedance to the channel 405. FIG. 5A further shows an electrical current 505, which represents the driver current I(t). Additionally, as can be seen the driver 403 and the element 503 are connected to the ground terminals 415. Given a digital signal d(t), the driver voltage V(t) may be determined by employing the model 501, according to the following function describing the electrical properties of the model 501.

$$Y(s) = \frac{I(s)}{V(s)} \qquad [1]$$

FIG. 5B illustrates a model 507 that may be implemented to determine the receiver voltage W(t). Once the driver voltage V(t) is determined for a given digital signal d(t) and a given driver current I(t), the model 507 may be used to determine the receiver voltage W(t). As can be seen in FIG. 5B, the model 507 includes a current source 505, which represents the driver current I(t). The model 507 further includes an element 509 that represents the channel 405 and may be described by the following function.

$$K(s) = \frac{W(s)}{V(s)} \qquad [2]$$

As equation [2] illustrates, the receiver voltage W(t) can be found by employing the above described transformation. According to the theorem of equivalent source, the model 501 and the model 507 of FIG. 5A and FIG. 5B respectively exactly reproduce the electrical system 401 of FIG. 4. As described above, with some implementations of the invention, the driver 403 is a non-linear driver. Accordingly, the model 501 represents a non-linear transformation. Still, with further implementations, the transformation is also time invariant. More particularly, given the same initial conditions, an input that is shifted in time will produce a response that is shifted in time accordingly.

As indicated above, the illustrative systems represented in FIG. 4, FIG. 5A and FIG. 5B, as well as other electrical systems may be actual physical devices. Accordingly, the signals, voltages and currents present in the system may be measured for example, by an oscilloscope. However, more often, various implementations of the invention will be practiced in conjunction with a simulated instance of the electrical system. Accordingly, the signals, voltages, currents and other values present in the system may be simulated as well.

Additionally, those of skill in the art will appreciate that various tools exists for describing an electrical system mathematically. More particularly, various mathematical tools exist for describing the properties of an electrical system in the time domain and the frequency domain. The equations described herein may be further modified and converted using the available tools, for example, the Laplace or Fourier transforms. Such conversions and modification of the described methods and exemplary implementations of the invention are within the scope of this disclosure.

Generating a Test Sequence for a Non-Linearly Driven Channel

Figure 6:
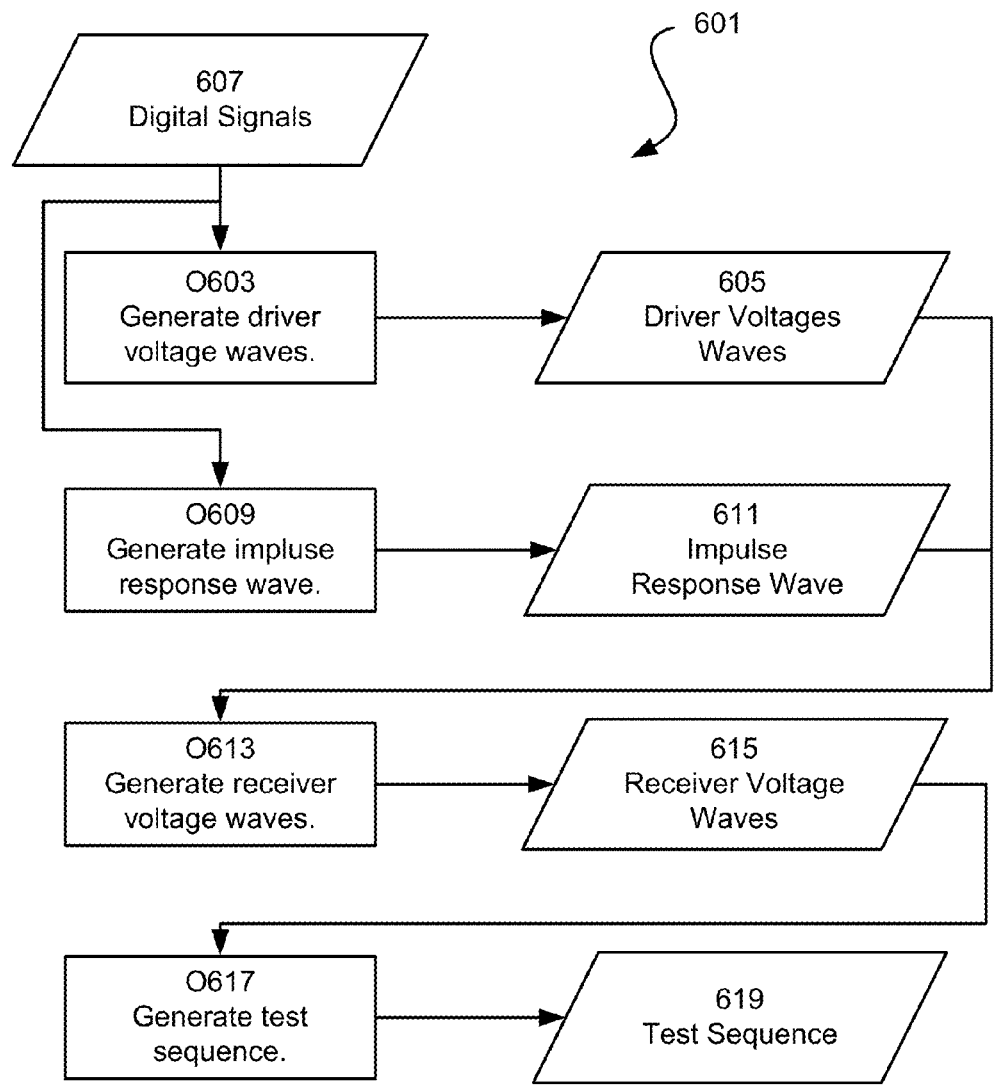
FIG. 6 a method of selecting a "worst" case test sequence for a non-linearly driven channel.

FIG. 6 illustrates a method 601 that may be implemented according to various embodiments of the present invention. The method 601 may be employed to generate a "worst" case test sequence for a non-linearly driven channel, for example, the driver 403 and the channel 405 combination of FIG. 4. The driver and the channel for which a test sequence may be generated, is often referred to herein as the driver under test or the channel under test. The method 601 includes an operation 603 for generating a plurality of driver voltage waves 605 based upon selected bit sequences 607. With various implementations of the invention, the selected bit sequences 607 are randomly selected bit sequences. With still other implementations of the invention, the selected bit sequences 607 are all possible bit sequences of a given length. The method 601 further includes an operation 609 for generating an impulse response 611 of the channel under test, an operation 613 for combining the plurality of driver voltage waves 605 with the impulse response 611, forming a plurality of receiver voltage waves 615, and an operation 617 for generating a test sequence 619 based upon the plurality of receiver voltage waves 615.

Figure 7:
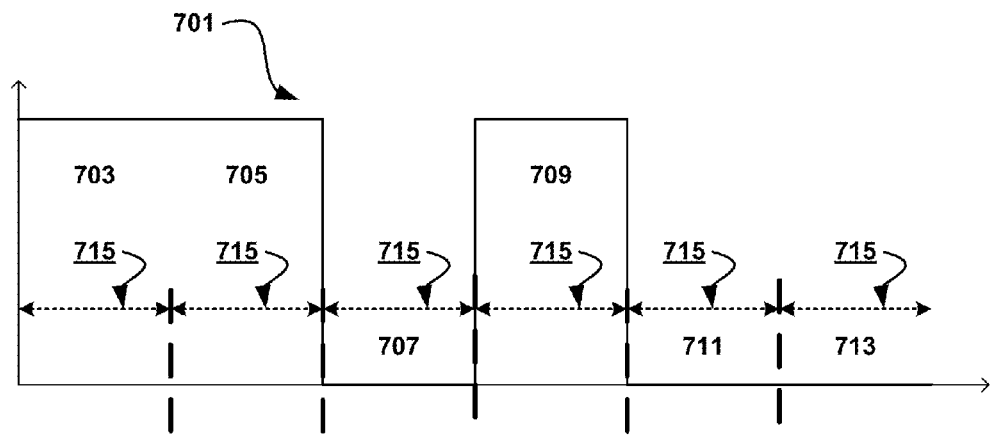
FIG. 7 illustrates an ideal digital signal.

As stated, the driver voltage waves 605 are generated based upon a plurality of bit sequences 607. The bit sequences 607, typically each correspond to a digital signal d(t). FIG. 7 illustrates an idealized digital signal 701. As can be seen in FIG. 7, the digital signal 701 includes six (6) cycles or 'bits' 703-713. If the high portions of the digital signal 701 are assigned a value of logical "1," and the low portions of the digital signal 701 are assigned a value of logical "0," then the digital signal 701 could be represented as the bit sequence '110100'. FIG. 7 further illustrates a bit interval length 715 corresponding to each bit 703-713. The bit interval length 715 is often measured in time. With various implementations of the invention, the digital signal 701 is applied to the input of an electrical system, such as the input 409 of FIG. 4. With further implementations of the invention, the digital signal 701 is employed to allow the measurement, simulation, or derivation of the driver voltage V(t) and the receiver voltage W(t).

Figure 8:
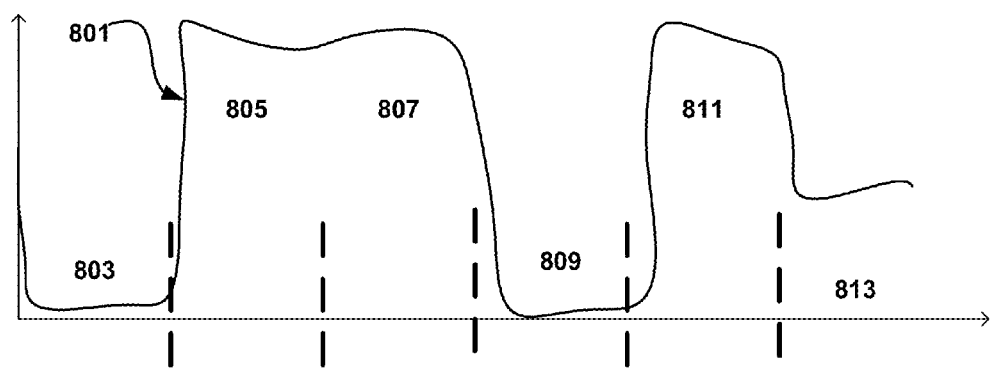
FIG. 8 illustrates a voltage waveform.
Figure 9:
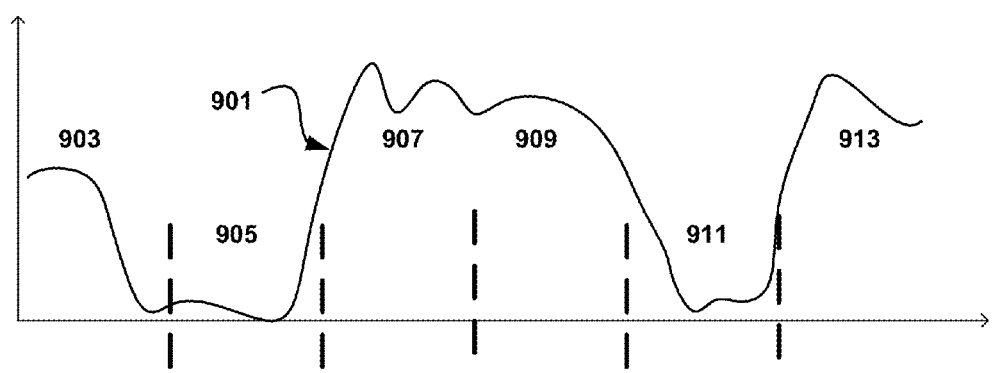
FIG. 9 illustrates an impulse response signal.

Let the digital signal, or bit sequence 701, be d(t). FIG. 8 shows a voltage waveform 801, which illustrates the simulated driver voltage V(t) given the digital signal d(t). Additionally, FIG. 9 shows a voltage waveform 901, which illustrates the simulated receiver voltage W(t) given the driver voltage V(t). As can be seen in FIG. 8, the voltage waveform 801 has six (6) cycles or bits 803-813, and can be represented by the bit sequence '011010'. Furthermore, the voltage waveform 901 shown in FIG. 9 has six (6) cycles or bits 903-913, and can be represented by the bit sequence '001101'.

Figure 10:
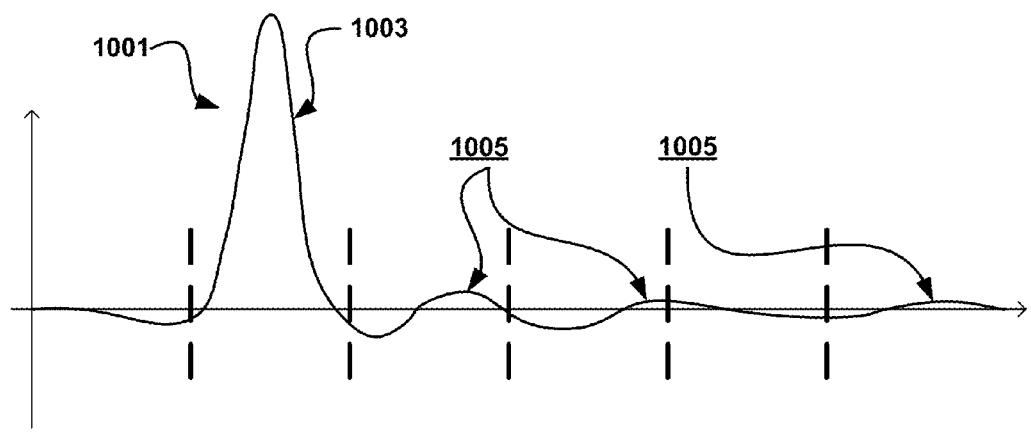
FIG. 10 illustrates an altered version of the impulse response of FIG. 9.

Referring back to FIG. 6, the method 601 includes the operation 603 for generating the plurality of driver voltage waves 605. In various implementations of the invention, the driver voltage waves 605 are simulated voltage waves based upon the selected bit sequences 607, such as the simulated voltage waveform 801 that is based upon the bit sequence 701. The method 601 further includes the operation 609 for generating the impulse response wave 611 of the channel under test. FIG. 10 shows an impulse response waveform 1001, which may represent the impulse response 611 of the channel under test, such as the channel 405 of FIG. 4. Those of skill in the art will appreciate that the impulse response 611 may have a considerable, although finite duration. More particularly, as illustrated in FIG. 10, the impulse response waveform 1001 contains an impulse 1003 and a plurality of transient amplitude fluctuations 1005. The transient amplitude fluctuations 1005 may continue for a considerable time after the impulse 1003. The duration of the impulse response wave 611 may be dictated by the channel under test. For example, in some implementations, the impulse response wave 611 may be a total of 10 bits long. With other implementations, the impulse response wave 611 may be 100 bits or greater long. Still, with other implementations of the invention, the impulse response wave 611 is truncated and assigned a selected length, such as the length of the driver voltage waves 605. For example, the impulse response wave 1001 has a total length of six (6) bits, which may correspond to the six (6) bits of the voltage waveform 801.

With various implementations of the invention, the impulse response 611 of the channel under test is measured. With other implementations of the invention, the impulse response 611 of the channel under test is derived, for example by application of the inverse Laplace transform to Equation [2]. With still other implementations of the invention, the impulse response 611 of the channel under test is simulated, for example by applying a Dirac pulse to a simulated instance of the channel under test.

In various implementations of the invention, the relationship between the driver voltage waves 605 and the receiver voltage waves 615 may be characterized by Equation [3], where k(t) is the impulse response wave 611 of the channel under test.

$$W(t) = \int_{-\infty}^{t} k(t-\tau)V(\tau)d\tau \quad [3]$$

The method 601 illustrated in FIG. 6, includes the operation 613 for generating the receiver voltage waves 615, which may be performed for example by application of Equation [3]. More particularly, for a known impulse response wave 611 and given driver voltage waves 605, the receiver voltage waves 615 may be derived or simulated.

The method 601 further includes the operation 617 for generating a test sequence 619 from the receiver voltage waves 615. It is to be appreciated that the receiver voltage waves 615 are based upon the impulse response wave 611 and the driver voltage waves 605, as explained. Additionally, it is to be appreciated that since the impulse response wave 611 is dependent upon various properties of the channel under test, it does not change throughout performance of the method 601. Furthermore it is to be appreciated that the driver voltage waves 605 are dependent upon the selected bit sequences 607. In various implementations of the invention, the operation 617 selects as the test sequence 619, a one of the digital signals 607 that corresponds to the maximum one of the receiver voltage waves 615. With other implementations of the invention, the operation 617 selects as the test sequence 619, a one of the digital signals 607 that corresponds to the minimum one of the receiver voltage waves 615.

Generating the Driver Voltage Waves

As stated above, with various implementations of the invention, the driver is non-linear. More particularly, transforming the digital signal d(t) into the driver voltage V(t) is a non-linear transformation. This non-linearity is further extended by the fact that many modern drivers contain 'bit taps,' or feedback loops, which act to extend the affect of a given bit upon the future state of the driver. Due to the non-linear nature of the driver, for example the driver 403, the initial state of the driver is defined by several preceding bits in the digital signal d(t). More particularly, for any given bit L within the digital signal d(t), the driver voltage V(t) depends upon the bit L and a number of preceding bits P within the digital signal d(t). The number of preceding bits P is often referred to as the history depth and depends upon the non-linear characteristics of the driver. Additionally, the history depth may further depend upon other electrical characteristics of the system, for example, characteristics of the channel under test.

Figure 11:
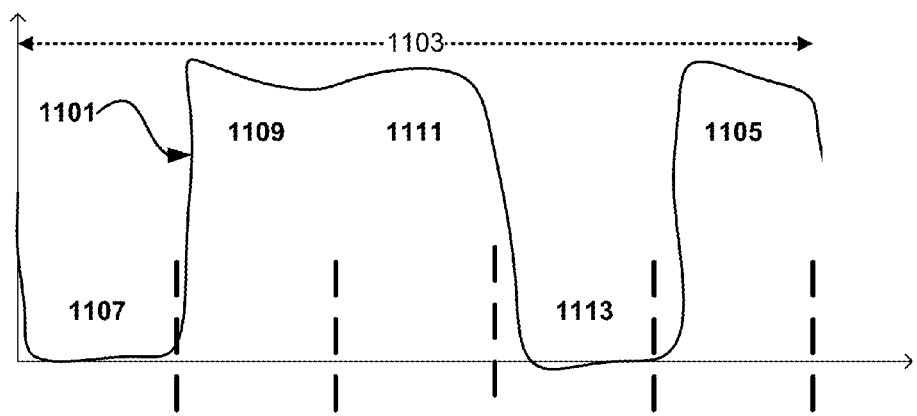
FIG. 11 illustrates the digital signal of FIG. 7.

As explained, the driver voltage V(t) for a given bit L depends upon P preceding bits. Accordingly, there are $2^P$ possible combinations of preceding bit sequences upon which a given bit in the driver voltage may depend. The driver voltage wave corresponding to a given bit L and any of the $2^P$ possible preceding bit sequence combinations is often referred to as a bit wave. Accordingly, there are $2^{P+1}$ possible bit waves for a given driver and channel combination. FIG. 11 illustrates a driver voltage wave 1101. Assuming the driver has a history depth of four (4) bits, a bit wave 1103 corresponding to a bit 1105 may be formed by preceding bits 1107-1113 and the bit 1105. With some implementations of the invention a notation may be used to denote a bit wave. For example, the bit wave 1103 may be denoted by the notation $V_{01101}$. This notation is formed by noting the logical value for each of the preceding bits corresponding to the history depth, in this case four (4), followed by the given bits logical value. Often the notation sets the given bits logical value off with a distinctive textual feature, for example bolding.

As stated above, with various implementations of the invention, the operation 603 of FIG. 6 generates the driver voltage waves 605 from the digital signals 607. In some implementations of the invention, the driver voltage waves 605 correspond to a subset of the $2^{P+1}$ possible bit waves. In other implementations of the invention, the driver voltage waves 605 correspond to all of the $2^{P+1}$ possible bit waves.

FIG. 12 illustrates a method 1201 that may be implemented according to various embodiments of the invention to determine a plurality of bit waves 1203 for a selected bit within a digital signal 1205. For example, the method 1201 may be employed to determine the bit wave 1103 for the bit 1105. It is to be appreciated that the bit 1105 corresponds to a selected bit within a digital signal, for example, the bit 709 of the digital signal 701 shown in FIG. 7. Furthermore, it is to be appreciated that the method 1201 may employ measurement, simulation, or derivation techniques to generate the bit waves 1203 based upon an electrical system 1207.

With various implementations of the invention, the method 1201 is employed to perform the operation 603 of the method 601 shown in FIG. 6. The method 1201 includes an operation 1209 for determining a delay associated with the electrical system 1207, an operation 1211 for determining a history depth associated with the electrical system 1207, and an operation 1213 for generating the plurality of bit waves 1203 associated with the selected bit from the digital signal 1205. In various implementations of the invention, the bit waves 1203 are saved to a memory storage location.

With various implementations of the invention, the delay and history depth for a given electrical system are predefined. Accordingly, the operation 1209 and the operation 1211 determine the delay and history depth respectively by accessing their predefined values from a memory storage location. With other implementations of the invention, the operation 1209 determines the delay by the method 1301 illustrated in FIG. 13.

Figure 13:
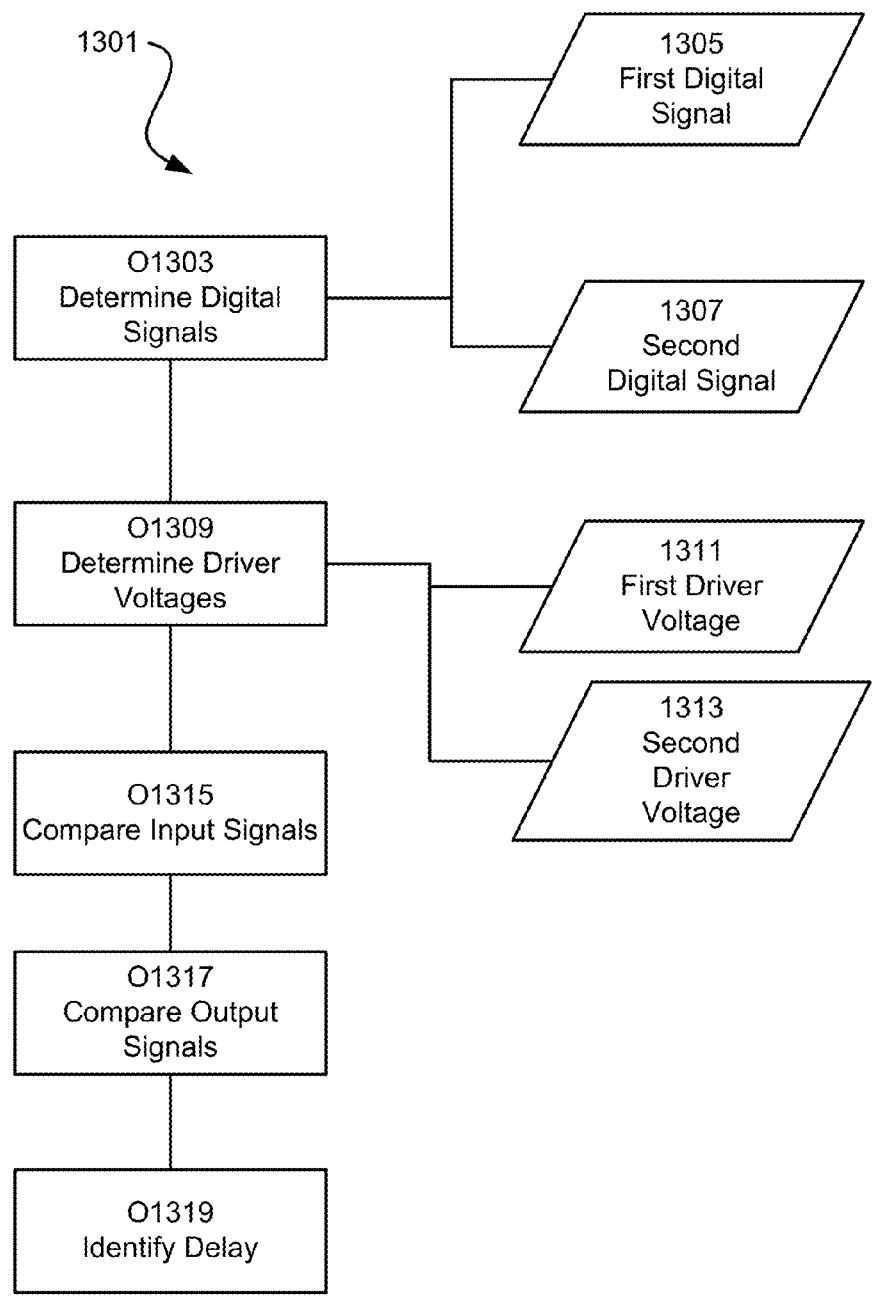
FIG. 13 illustrates a method for determining a delay associated with an electronic system.

As can be seen in FIG. 13, the method 1301 includes an operation 1303 for generating a first digital signal 1305 and a second digital signal 1307. With various implementations of the invention, the first digital signal 1305 and the second digital signal 1307 will have the same bit sequence except for the final bit. For example, the bit sequence '1100' could be used for the first digital signal 1305. Accordingly, the bit sequence '1101' would be used for the second bit sequence 1307. With other implementations of the invention, the first digital signal 1305 and the second digital signal 1307 will have at least one bit in common, followed by a differing logical value. More particularly, at least one selected bit from the first digital signal 1305 will have the same logical value, i.e. 0 or 1, as the selected bit from the second digital signal 1307, while the following bits in the digital signals will different logical values. For example, the third ($3^{rd}$) bit and the fourth ($4^{th}$) bit in the first digital signal 1305 might be '00'. Accordingly, the third ($3^{rd}$) bit in the second digital signal 1307 would be '0' while the fourth ($4^{th}$) bit in the second digital signal 1307 would be '1'. With still other implementations of the invention, the first digital signal 1305 and the second digital signal 1307 will be predefined, and not change each time the method 1301 if performed.

The method 1301 further includes an operation 1309 for determining a first driver voltage 1311 and a second driver voltage 1313. In various implementations of the invention, the first driver voltage 1309 is the response of the driver to the first digital signal 1305 and the second driver voltage 1313 is the response of the driver to the second digital signal 1307. The method 1301 additionally includes an operation 1315 for comparing the first digital signal 1305 and the second digital signal 1307, an operation 1317 for comparing the first driver voltage 1311 and the second driver voltage 1313, and an operation 1319 for identifying a delay. With various implementations of the invention, the delay corresponds to the time between the change in the first digital signal 1305 and the second digital signal 1307 and the change in the first driver voltage 1311 and the second driver voltage 1313.

Figure 14:
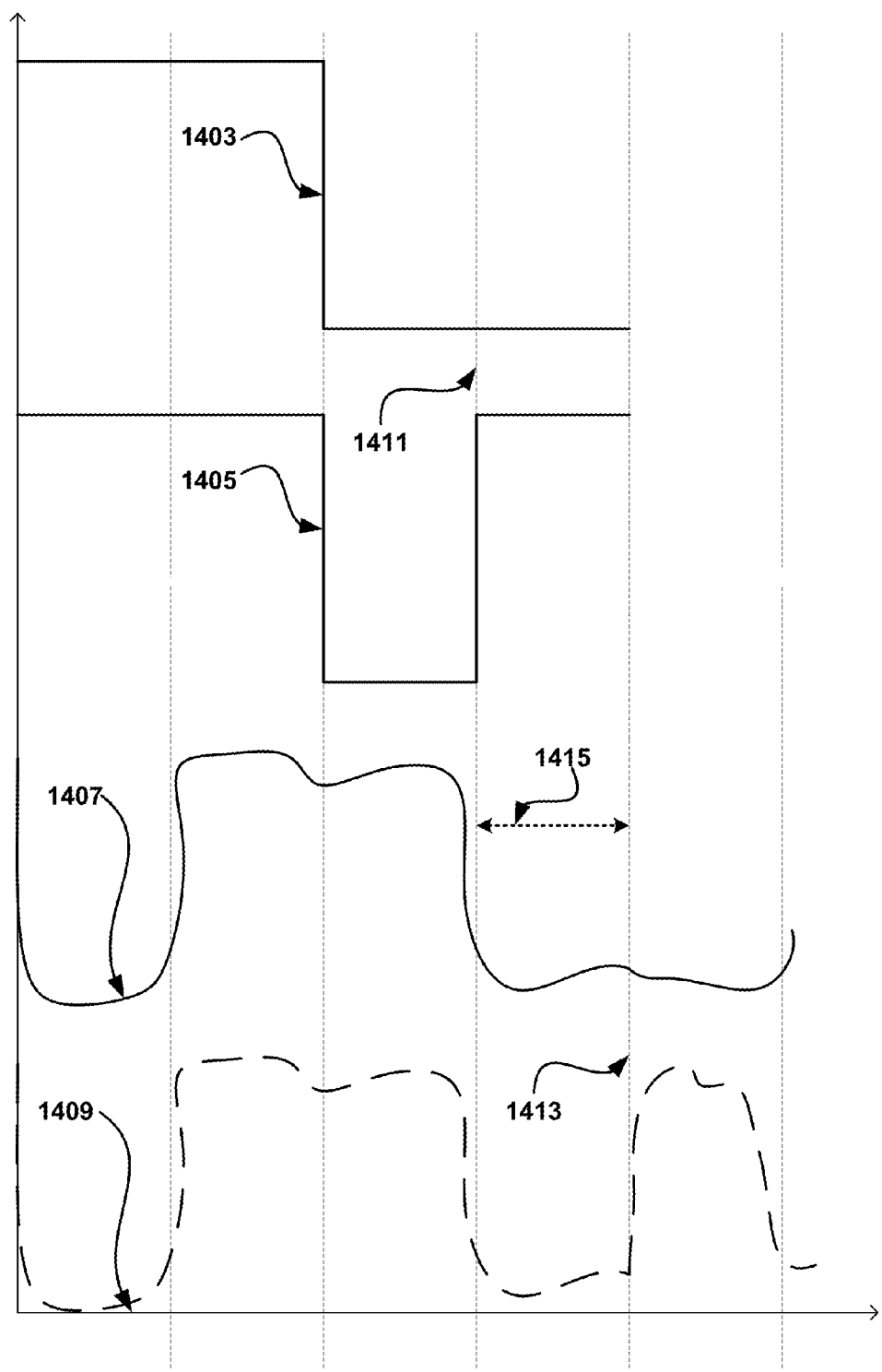
FIG. 14 illustrates various signals and an associated delay between the signals.

FIG. 14 illustrates a first digital signal 1403, a second digital signal 1405, a first driver voltage 1407 corresponding to the first digital signal 1403, and a second driver voltage 1409 corresponding to the second digital signal 1405. As can be seen in FIG. 14, the first digital signal 1403 and the second digital signal 1405 differ only in their last bit. More particularly, the first digital signal 1403 may be represented by the bit sequence having the logical value '1100' and the second digital signal 1405 may be represented by the bit sequence having the logical value '1101'. A point 1411, where the first digital signal 1403 and the second digital signal 1405 change is also shown in FIG. 14. Additionally, a point 1413, where the first driver voltage 1407 and the second driver voltage 1409 change is shown. Furthermore, FIG. 14 illustrates a delay 1415 between the point 1411 and the point 1413.

FIG. 15 illustrates a method 1501 that may be implemented according to various embodiments of the present invention to perform the operation 1211 of FIG. 12, and determine the history depth P associated with a given electrical system 1207. As can be seen in FIG. 15, the method 1501 includes an operation 1503 for determining a first driver voltage 1505 and a second driver voltage 1507. The method 1501 further includes an operation 1509 for comparing the first driver voltage 1505 and the second driver voltage 1507, and an operation 1511 for identifying a length of propagation. In various implementations of the invention, the first driver voltage 1505 and the second driver voltage 1507 will be generated based upon the same bit sequence, except for the first bit in the sequence. For example, the first driver voltage 1505 may be generated based upon the bit sequence having a logical value of '11101', accordingly the second driver voltage 1507 would be generated based upon the bit sequence having a logical value of '01101'.

Figure 16:
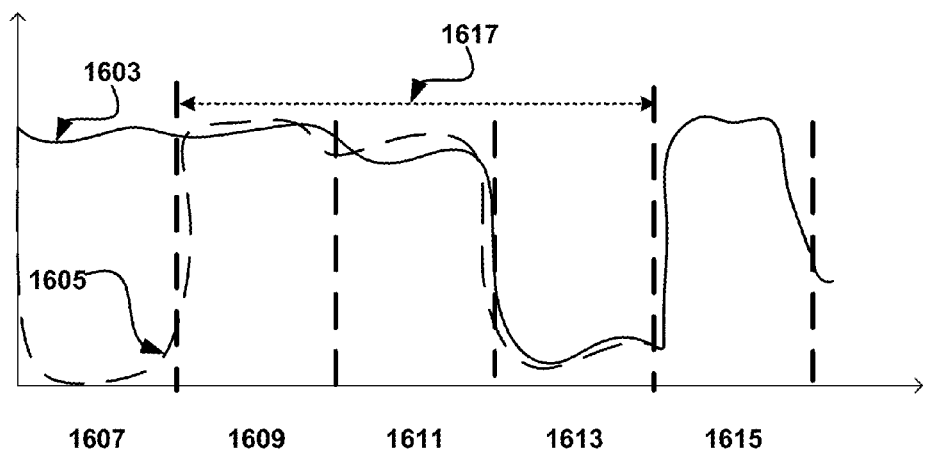
FIG. 16 illustrates various signals and a history depth present in the signals.

FIG. 16 illustrates a first driver voltage 1603, a second driver voltage 1605, and five (5) bit intervals 1607-1615. As can be seen in FIG. 16, in bit interval 1607 the first driver voltage 1603 and the second driver voltage 1605 have a different logical value. More particularly, the first driver voltage has a logical value of '1' during the bit interval 1607 while the second driver voltage 1605 has a logical value of '0' during the same bit interval. The first driver voltage 1603 and the second driver voltage 1605 have the same logical values for the bit intervals 1609-1615. Additionally, as illustrated in FIG. 16, the differing logical value between the between the first driver voltage 1603 and the second driver voltage 1605 during the bit interval 1607 causes a slight difference in amplitude to propagate through the following three (3) bit intervals. More particularly, during the bit intervals 1609-1613 the first driver voltage 1603 and the second driver voltage 1605, although having the same logical value have slightly different amplitudes, while the amplitudes are identical during the bit interval 1615. This illustrates that the history depth is three (3) bit intervals long for this particular example. As can be seen, the history depth corresponds to the length in bits that the difference in amplitude between the first driver voltage 1603 and the second driver voltage 1605 propagates once the logical values correspond to each other. The history depth is occasionally referred to as the prehistory.

In various implementations of the invention the history depth is determined based on a single pair of bit sequences. The determined history depth value, based upon this pair of bit sequences may then be used for generating test sequences for the electronic system under test. In other implementations of the invention, the history depth is determined based on multiple pairs of bit sequences. The largest determined history depth may then be used for generating test sequences for the electronic system under test. Alternatively, the determined history depths could be averaged, and the average history depth could be used for generating test sequences for the electronic system under test.

Determining the Impulse Response and the Receiver Voltage Waves

Figure 17:
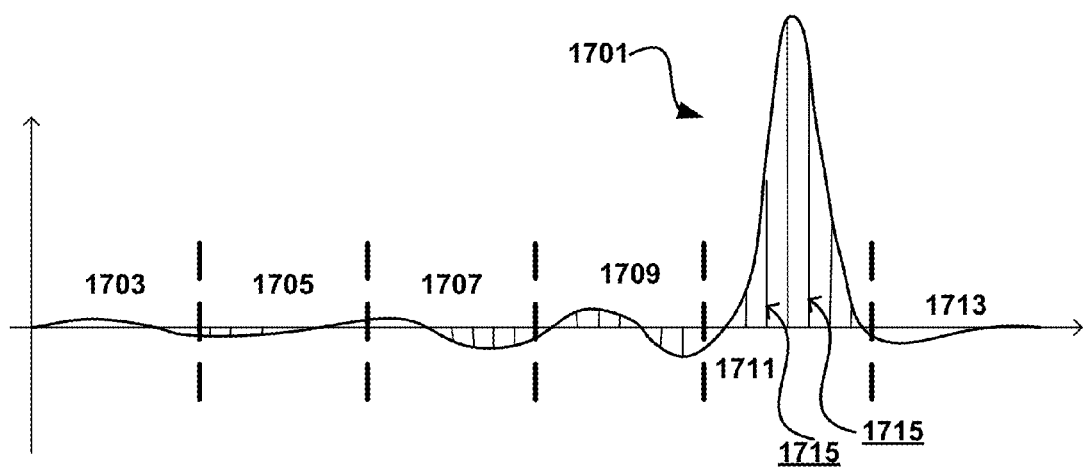
FIG. 17 illustrates a signal and associated bit waves within the signal.

Returning again to FIG. 6, the method 601 contains the operation 609 for generating the impulse response wave 611. As stated, FIG. 10 illustrates an impulse response wave 1001 that may be generated according to various implementations of the invention. With further implementations of the invention, the impulse response wave 611 is inverted in time and sampled at discrete time intervals. FIG. 17 illustrates an impulse response wave 1701 having bit intervals 1703-1713. As can be seen from FIG. 10 and FIG. 17, the impulse response wave 1701 is the time inverted impulse response wave 1001. Additionally, as can be seen from FIG. 17, the impulse response wave 1701 has been sampled at discrete time intervals 1715.

Let $f(t)$ equal the time inverted impulse response $k(t)$. In various implementations of the invention, the receiver voltage W(t) may be characterized by the following equation:

$$W(t_0) = \sum_{n=1}^{N} f(t_n) V(t_n), \quad [4]$$

where $t_0$ equals a selected bit within the digital signal d(t). As can be seen in Equation 4, the impulse response $f(t)$ and the driver voltage V(t) are discretely sampled along the interval n–N. With various implementations of the invention, the sample size N is selected at $\frac{1}{10}$ the length of the bit interval. With still other implementations of the invention, the sample size is selected as $\frac{1}{50}$ the length of the bit interval. The sample size N may be selected according to various criteria, some of which may be the amount of computing resources available, the desired accuracy of selecting the "worst" case test sequence, the time available for computation, or some other meaningful criteria.

Equation [4] shows that the receiver voltage W(t) for a given bit $t_0$ is the product of the impulse response $f(t)$ and the driver voltage V(t), summed over the interval n–N. In various implementations of the invention, the receiver voltages 615 are generated by application of Equation 4 to the impulse response wave 611 and the driver voltage waves 605.

The receiver voltage W(t), and accordingly the receiver voltage waves 615 may further be represented by the following sum:

$$W = \sum_{l=1}^{L} \sum_{m=1}^{M} f_{l,m} V_{l,m}, \quad [5]$$

where L equals the number of bits within the sample and M equals the number of samples within each bit interval. With various implementations of the invention, L equals the history depth plus one (1) bit length, or L=P+1. With still other implementations of the invention, L equals the length of the impulse response. In various implementations of the invention, the impulse response wave 611 is shifted such that the impulse, for example, the impulse 1003 of FIG. 10, aligns with the selected bit 1.

Generating The Test Sequence

As stated above, with various implementations of the invention, the operation 617 for generating a test sequence 619 from the receiver voltage waves 615 selects as the test sequence 619, a bit sequence that either maximizes or minimizes the receiver voltage waves 615. Additionally, as indicated by the above description, the receiver voltage depends upon the impulse response k(t) of the channel under test and the driver voltage V(t). As the driver voltage V(t) depends upon a number of bits P equal to the prehistory, there are $2^{P+1}$ possible bit sequences that may effect the receiver voltage W(t). Accordingly, a test sequence that either maximizes or minimizes the receiver voltage W(t) would need to have a length of at least $2^{P+1}(P+1)$ bits. It is to be appreciated that a bit sequence of length $2^{P+1}(P+1)$ would contain all possible bit waves.

Figure 18:
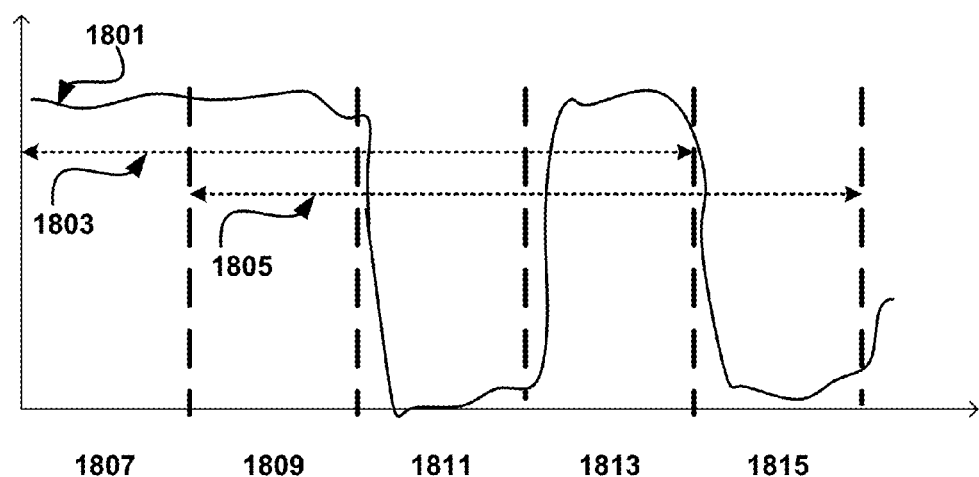
FIG. 18 illustrates a signal and overlapping bit sums within the signal.

Although a test sequence of length $2^{P+1}(P+1)$ would typically provide a "worst case" test sequence, P may be more than 100 bits long, which would require a test sequence of over 2.56e32 bits. Applying a test pattern of that length to an electrical system is computationally and cost prohibitive. Accordingly, a shorter test sequence, which also satisfies the "worst case" qualities, is desired. By application of various implementations of the invention, a "worst case" test sequence may be considerably shorter that $2^{P+1}(P+1)$ and still contain all possible bit waves, if the bit waves are allowed to overlap. FIG. 18 illustrates a five (5) bit long voltage wave 1801, which contains a first bit wave 1803 and a second bit wave 1805. The first bit wave 1803, which may be referenced by the notation $V_{1101}$ occupies the bit intervals 1807-1813. Additionally, the second bit wave 1805, which may be denoted by the notation $V_{1010}$ occupies the bit intervals 1809-1815. As can be seen in FIG. 18, the first bit wave 1803 and the second bit wave 1805 overlap. However, the distinct bit waves illustrated by the first bit wave 1803 and the second bit wave 1805 may still be determined.

Letting β equal a P+1 digit binary code representing a bit wave, Equation [5] may be rewritten as follows:

$$W = \sum_{l=1}^{L} \sum_{m=1}^{M} f_{l,m} V_{\beta}(m) \quad [6]$$

The subscript β may be referred to as the index and the internal sum of Equation [6], or $$\sum_{m=1}^{M} f_{l,m} V_\beta(m),$$

may be referred to as a bit sum. The bit sum value depends upon the selected bit interval l, the bit wave, and the time inverted impulse response of the channel under test. In various implementations of the invention, the following equation may be used to generate the bit sum.

$$S_{l,\beta} = \sum_{m=1}^{M} f_{l,m} V_\beta(m) \quad [7]$$

As there are $2^{P+1}$ possible bit waves, there may be $2^{P+1}(L)$ possible different bit sums. Employing $S_{l,\beta}$ as the notation for a bit sum, the receiver voltage may be rewritten in the following form.

$$W = \sum_{l=1}^{L} S_{l,\beta} \quad [8]$$

FIG. 19 illustrates a method 1901, which may be implemented according to various embodiments of the present invention to generate the test sequence 619. The method 1901 includes an operation 1903 for generating a plurality of bit sums 1905. The operation 1903 takes as input a plurality of bit waves 1907 and the impulse response wave 611. In various implementations of the invention, the plurality of bit waves 1907 are generated by application of the method 1201 illustrated in FIG. 12. In other implementations of the invention, the bit waves 1907 are provided in a memory storage location and the method 1901 accesses the provided bit waves 1907 from the memory storage location. With further implementations of the invention, the bit sums 1905 are generated by application of the equations detailed above, such as Equation [7].

The method 1901 further includes an operation 1909 for traversing the bit sums 1905, resulting in the test sequence 619. As detailed above, in various implementations of the invention, a bit sum is generated that corresponds to each individual bit within the bit waves 1907. More particularly, if the history depth P equals two (2) bits, then there are eight (8) different bit waves 1907, four (4) for a logic '0' value and four (4) for a logic '1' value. Accordingly, as each of the bit waves 1907 is three (3) bits long, there would be 24 different bit sums 1905.

Figure 21:
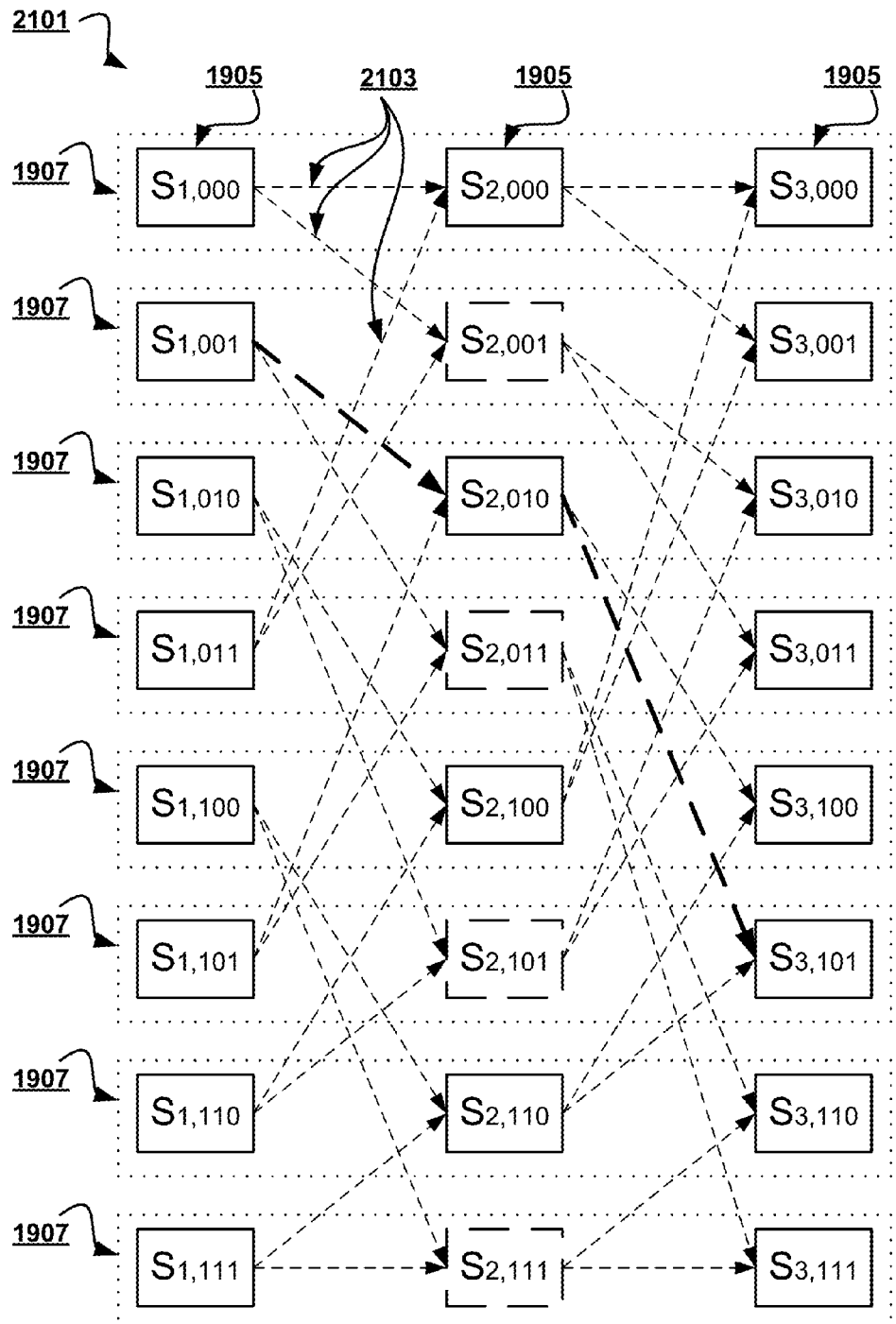
FIG. 21 illustrates a transition chart between bit sums associated with an electronic system.

With various implementations of the invention, the operation 1909 for traversing the bit sums 1905 is performed according to the method 2001 illustrated in FIG. 20. As shown in FIG. 20, the method 2001 includes an operation 2003 for determining a plurality of traversal paths connecting the bit sums 1905. In various implementations of the invention, the plurality of traversal paths is determined based upon the index value. For example, FIG. 21 illustrates a transitions chart 2101. The transition chart 2101 illustrates possible transitions between the bit sums 1905. As can be seen, the transition chart 2101 was generated assuming a prehistory of two (2) bits. Accordingly, there are eight (8) different bit waves 1907 and 24 different bit sums 1905, one bit sum 1905 for each individual bit within the eight (8) bit waves 1907.

As described above, a test sequence may contain overlapping bit waves, such as the signal 1801 of FIG. 18. The transition chart 2101 of FIG. 21 shows that each bit sum 1905 may be followed by either of two other bit sums 1905. For example, the bit sums 1905 corresponding to the index value '000', such as $S_{1,000}$, may be followed either by a bit sum having an index value of '000' or a bit sum having an index value of '001'. This follows from there only being two possible binary logical values, and the two (2) bit prehistory. Accordingly, the first two (2) bits of the index for the current bit sum 1905 become the last two (2) bits of the index for the following bit sum 1905. The transition chart 2101 includes a plurality of transition paths 2103 showing possible transitions between the various bit sums 1905. For example, the transition paths 2103 set off in bold in FIG. 21 connect the bit sums $S_{1,001}$, $S_{2,010}$, and $S_{3,101}$.

Referring back to FIG. 20, the method 2001 includes an operation 2005 for determining the local costs associated with each bit sum 1905. In various implementations of the invention, the local cost for each bit sum 1905 is the value of the individual bit sum as defined by Equation [7]. The method 2001 additionally includes an operation 2007 for determining a plurality of possible test sequences 2009. The plurality of possible test sequences 2009 may be constructed to correspond to each of the possible transition paths 2003. For example, the transition chart 2101 of FIG. 21 shows how 32 different possible test sequences 2009, each five (5) bits in length, may be constructed by traversing the bit sums 1905 along the possible transition paths 2103. More particularly, the bit sequence corresponding to the index of a selected one of the bit sums 1905 may be combined with the bit sequence corresponding to the index of those bit sums 1905 connected to the selected one of the bits sums 1905 through selected transition paths 2003. For example, the test sequence having logical bit values of '00101' may be formed by combining the index sequences '001', '010', and '101'. As can be seen the bit sums 1905 corresponding to these index values are all connected by the transition paths 2103 highlighted in bold.

The method 2001 further includes an operation 2011 for optimizing the plurality of test sequences 2009 according to a cumulative cost associated with each of the plurality of test sequences 2009. In various implementations of the invention, each of the plurality of test sequences 2009 is assigned a cumulative cost based upon the local cost of the bit sums 1905. For example, the cumulative cost of a selected one of the plurality of test sequences 2009 may equal the sum of the local costs for each of the bit sums 1905 employed to construct the selected one of the plurality of test sequences 2009. Returning again to FIG. 19, in various implementations, the operation 1909 selected as the test sequence 619, one of the plurality of test sequences 2009 based upon the optimization performed by the operation 2011, such as the cumulative costs.

As stated above, in various implementations of the invention, the generated test sequence 619 is the test sequence that either maximizes or minimizes the receiver voltage waves 615. Accordingly, with various implementations of the invention, the one of the possible test sequence 2009 that has the highest cumulative cost is selected as the test sequence 619. With still other implementations of the invention, the one of the possible test sequences 2009 that has the lowest cumulative cost is selected as the test sequence 619. More particularly, for a sampled bit l, within the bit waves 1907, having a logical value of '1', various implementations of the invention will cause the one of the possible test sequences 2009 that has the lowest cumulative cost to be selected as the test sequence 619. Alternatively, for a sampled bit l, within the bit waves 1907, having a logical value of '0', various implementations of the invention will cause the one of the possible test sequences 2009 that has the highest cumulative cost to be selected as the test sequence 619.

It is to be appreciated that the transition chart 2101 of FIG. 21 is shown for illustrative purposes only, and the size of the chart and the number of the bit waves 1907 and bit sums 1905 will depend upon various factors, such as the history depth P or the duration of the impulse response 611. Accordingly, a chart similar to the transition chart 2101 may be extended depending upon various factors, such as the history depth P or the duration of the impulse response 611.

CONCLUSION

Various implementations of the invention provide methods and apparatuses for generating a test sequence for a driver and channel combination, wherein the driver is non-linear. In various implementations of the invention, a test sequence is generated that produces the worst or near worst error rate of the channel. With various implementations of the invention, voltage waves at the driver and impulse response waves of the channel are generated. In various implementations of the invention, the driver voltage waves and impulse response waves are simulated responses of the driver and channel to a digital signal input. With further implementations of the invention, receiver voltage waves are generated by combining the impulse response wave and the driver voltage waves. Subsequently, a test sequence is selected based upon the combined receiver voltage wave.

Although certain devices and methods have been described above in terms of the illustrative embodiments, the person of ordinary skill in the art will recognize that other embodiments, examples, substitutions, modification and alterations are possible. It is intended that the following claims cover such other embodiments, examples, substitutions, modifications and alterations within the spirit and scope of the claims.

What is claimed is:

1. An apparatus comprising at least one non-transitory computer-readable memory device storing instructions configured to cause one or more processing devices to perform operations comprising:
    determining multiple receive waveforms capable of being output from a channel of an electrical system in response to corresponding drive waveforms input to the channel;
    generating a set of test bit sequences, each test bit sequence correlated to a plurality of the receive waveforms based, at least in part, on bit sequences capable of being utilized by a driver to generate the drive waveforms; and
    selecting a test bit sequence from the set of test bit sequences based, at least in part, on characteristics of the receive waveforms correlated to the test bit sequences; and
    driving the channel of the electrical system with a test drive waveform generated by the driver in response to the selected test bit sequence, wherein the test receive waveform output from the channel in response to test drive waveform input to the channel indicates a signal integrity of the channel.

2. The apparatus of claim 1, wherein the instructions are configured to cause the one or more processing devices to perform operations further comprising determining a history depth based, at least in part, on non-linear characteristics of the driver, wherein a number of bits in each of the bit sequences utilized by the driver to generate the drive waveforms is based on the history depth.

3. The apparatus of claim 1, wherein determining the multiple receive waveforms further comprises combining the drive waveforms with a channel response waveform corresponding to response characteristics of the channel, which generates the receive waveforms.

4. The apparatus of claim 1, wherein correlating each receive waveform to at least one test bit sequence in the set of test bit sequences further comprises:
    determining at least one different overlapping combination of the bit sequences for each test bit sequence;
    identifying the drive waveforms generated by the driver based on the bit sequences in each of the overlapping combination of the bit sequences; and
    correlating each receive waveform to at least one test bit sequence in the set of test bit sequences based, at least in part, on an association of the receive waveforms to the identified drive waveforms.

5. The apparatus of claim 1, wherein determining the multiple receive waveforms further comprises sampling each receive waveform over a bit interval to generate bit sums, each bit sum corresponding to a different bit sequence utilized by the driver to generate the drive waveform.

6. The apparatus of claim 5, wherein correlating each receive waveform to at least one test bit sequence in the set of test bit sequences further comprises correlating each test bit sequence to a different set of the bit sequences.

7. The apparatus of claim 6, wherein the bit sequences in each set of the bit sequences overlap.

8. The apparatus of claim 6, wherein selecting a test bit sequence from the set of test bit sequences further comprises:
    aggregating, for test bit sequence, the bit sums corresponding to the set of bit sequences correlated to the test bit sequence; and
    selecting the test bit sequence from the set of test bit sequences based, at least in part, on the aggregated bit sums for the test bit sequences.

9. The apparatus of claim 1, wherein selecting a test bit sequence from the set of test bit sequences further comprises selecting the test bit sequence from the set of test bit sequences having a highest voltage when the test bit sequence corresponds to a logical low level.

10. The apparatus of claim 1, wherein selecting a test bit sequence from the set of test bit sequences further comprises selecting the test bit sequence from the set of test bit sequences having a lowest voltage when the test bit sequence corresponds to a logical high level.

11. A method comprising:
    determining, by a computing system, multiple receive waveforms capable of being output from a channel of an electrical system in response to corresponding drive waveforms input to the channel;
    correlating, by the computing system, each receive waveform to multiple test bit sequences in a set of test bit sequences based, at least in part, on bit sequences capable of being utilized by a driver to generate the drive waveforms;
    selecting, by the computing system, a test bit sequence from the set of test bit sequences based, at least in part, on characteristics of the receive waveforms correlated to the test bit sequences; and
    driving the channel of the electrical system with a test drive waveform generated by the driver in response to the selected test bit sequence, wherein the test receive waveform output from the channel in response to test drive waveform input to the channel indicates a signal integrity of the channel.

12. The method of claim 11, further comprising determining, by the computing system, a history depth based, at least in part, on non-linear characteristics of the driver, wherein a number of bits in each of the bit sequences utilized by the driver to generate the drive waveforms is based on the history depth.

13. The method of claim 11, wherein determining the multiple receive waveforms further comprises combining the drive waveforms with a channel response waveform corresponding to response characteristics of the channel, which generates the receive waveforms.

14. The method of claim 11, wherein correlating each receive waveform to at least one test bit sequence in the set of test bit sequences further comprises:
   determining at least one different overlapping combination of the bit sequences for each test bit sequence;
   identifying the drive waveforms generated by the driver based on the bit sequences in each of the overlapping combination of the bit sequences; and
   correlating each receive waveform to at least one test bit sequence in the set of test bit sequences based, at least in part, on an association of the receive waveforms to the identified drive waveforms.

15. The method of claim 11, wherein determining the multiple receive waveforms further comprises sampling each receive waveform over a bit interval to generate bit sums, each bit sum corresponding to a different bit sequence utilized by the driver to generate the drive waveform.

16. The method of claim 15, wherein correlating each receive waveform to at least one test bit sequence in the set of test bit sequences further comprises correlating each test bit sequence to a different set of the bit sequences.

17. The method of claim 16, wherein the bit sequences in each set of the bit sequences overlap.

18. The method of claim 16, wherein selecting a test bit sequence from the set of test bit sequences further comprises:
   aggregating, for test bit sequence, the bit sums corresponding to the set of bit sequences correlated to the test bit sequence; and
   selecting the test bit sequence from the set of test bit sequences based, at least in part, on the aggregated bit sums for the test bit sequences.

19. The method of claim 11, wherein selecting a test bit sequence from the set of test bit sequences further comprises selecting the test bit sequence from the set of test bit sequences having a highest voltage when the test bit sequence corresponds to a logical low level.

20. The method of claim 11, wherein selecting a test bit sequence from the set of test bit sequences further comprises selecting the test bit sequence from the set of test bit sequences having a lowest voltage when the test bit sequence corresponds to a logical high level.

21. A system comprising:
   a memory system configured to store machine-readable instructions; and
   a computing system including one or more processing devices, in response to executing the machine-readable instructions, configured to:
      determine multiple receive waveforms capable of being output from a channel of an electrical system in response to corresponding drive waveforms input to the channel;
      correlate each receive waveform to multiple test bit sequences in a set of test bit sequences based, at least in part, on bit sequences capable of being utilized by a driver to generate the drive waveforms;
      select a test bit sequence from the set of test bit sequences based, at least in part, on characteristics of the receive waveforms correlated to the test bit sequences; and
      drive the channel of the electrical system with a test drive waveform generated by the driver in response to the selected test bit sequence, wherein the test receive waveform output from the channel in response to test drive waveform input to the channel indicates a signal integrity of the channel.

22. The apparatus of claim 21, wherein the one or more processing devices, in response to executing the machine-readable instructions, are further configured to determine a history depth based, at least in part, on non-linear characteristics of the driver, wherein a number of bits in each of the bit sequences utilized by the driver to generate the drive waveforms is based on the history depth.

23. The apparatus of claim 21, wherein the one or more processing devices, in response to executing the machine-readable instructions, are further configured to combine the drive waveforms with a channel response waveform corresponding to response characteristics of the channel, which generates the receive waveforms.

24. The apparatus of claim 21, wherein the one or more processing devices, in response to executing the machine-readable instructions, are further configured to:
   determine at least one different overlapping combination of the bit sequences for each test bit sequence;
   identify the drive waveforms generated by the driver based on the bit sequences in each of the overlapping combination of the bit sequences; and
   correlate each receive waveform to at least one test bit sequence in the set of test bit sequences based, at least in part, on an association of the receive waveforms to the identified drive waveforms.

25. The apparatus of claim 21, wherein the one or more processing devices, in response to executing the machine-readable instructions, are further configured to sample each receive waveform over a bit interval to generate bit sums, each bit sum corresponding to a different bit sequence utilized by the driver to generate the drive waveform.

26. The apparatus of claim 25, wherein the one or more processing devices, in response to executing the machine-readable instructions, are further configured to correlate each test bit sequence to a different set of the bit sequences.

27. The apparatus of claim 26, wherein the bit sequences in each set of the bit sequences overlap.

28. The apparatus of claim 26, wherein the one or more processing devices, in response to executing the machine-readable instructions, are further configured to:
   aggregate, for test bit sequence, the bit sums corresponding to the set of bit sequences correlated to the test bit sequence; and
   select the test bit sequence from the set of test bit sequences based, at least in part, on the aggregated bit sums for the test bit sequences.

29. The apparatus of claim 21, wherein the one or more processing devices, in response to executing the machine-readable instructions, are further configured to select the test bit sequence from the set of test bit sequences having a highest voltage when the test bit sequence corresponds to a logical low level.

30. The apparatus of claim 21, wherein the one or more processing devices, in response to executing the machine-readable instructions, are further configured to select the test bit sequence from the set of test bit sequences having a lowest voltage when the test bit sequence corresponds to a logical high level.

* * * * *